United States Patent
Kang et al.

(10) Patent No.: US 11,462,553 B2
(45) Date of Patent: Oct. 4, 2022

(54) SEMICONDUCTOR DEVICE HAVING VERTICAL FENCE STRUCTURES

(71) Applicant: Samsung Electronics Co., Ltd., Suwon-si (KR)

(72) Inventors: Shinjae Kang, Seoul (KR); Woosung Lee, Yongin-si (KR); Jeonggil Lee, Hwaseong-si (KR); Hanmei Choi, Seoul (KR); Hauk Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 180 days.

(21) Appl. No.: 17/034,274

(22) Filed: Sep. 28, 2020

(65) Prior Publication Data
US 2021/0265373 A1    Aug. 26, 2021

(30) Foreign Application Priority Data

Feb. 24, 2020 (KR) .................. 10-2020-0022332

(51) Int. Cl.
| H01L 27/11556 | (2017.01) |
| H01L 27/11519 | (2017.01) |
| H01L 27/11526 | (2017.01) |
| H01L 23/522 | (2006.01) |
| H01L 27/11573 | (2017.01) |
| H01L 27/11582 | (2017.01) |
| H01L 27/11565 | (2017.01) |

(52) U.S. Cl.
CPC .... *H01L 27/11556* (2013.01); *H01L 23/5226* (2013.01); *H01L 27/11519* (2013.01); *H01L 27/11526* (2013.01); *H01L 27/11565* (2013.01); *H01L 27/11573* (2013.01); *H01L 27/11582* (2013.01)

(58) Field of Classification Search
None
See application file for complete search history.

(56) References Cited

U.S. PATENT DOCUMENTS

| 9,721,663 | B1 | 8/2017 | Ogawa et al. |
| 10,381,371 | B2 | 8/2019 | Ogawa et al. |
| 2019/0067321 | A1 | 2/2019 | Song et al. |
| 2019/0139976 | A1 | 5/2019 | Lee et al. |
| 2019/0148295 | A1 | 5/2019 | Lee et al. |
| 2019/0172838 | A1 | 6/2019 | Jo et al. |
| 2019/0237475 | A1 | 8/2019 | Jung et al. |
| 2019/0237477 | A1 | 8/2019 | Baek et al. |
| 2019/0244969 | A1 | 8/2019 | Lee et al. |
| 2019/0326315 | A1* | 10/2019 | Lee .................. H01L 27/11575 |

* cited by examiner

*Primary Examiner* — Hsien Ming Lee
(74) *Attorney, Agent, or Firm* — Harness, Dickey & Pierce, P.L.C.

(57) ABSTRACT

Semiconductor devices including a substrate including a cell array region and a through electrode region, an electrode stack on the substrate and including electrodes, vertical structures penetrating the electrode stack within the cell array region, vertical fence structures within an extension region and surrounding the through electrode region, and insulating layers being inside a perimeter defined by the vertical fence structures and being at the same level as the electrodes may be provided. The electrodes may include first protrusions protruding between the vertical fence structures in a plan view.

20 Claims, 31 Drawing Sheets

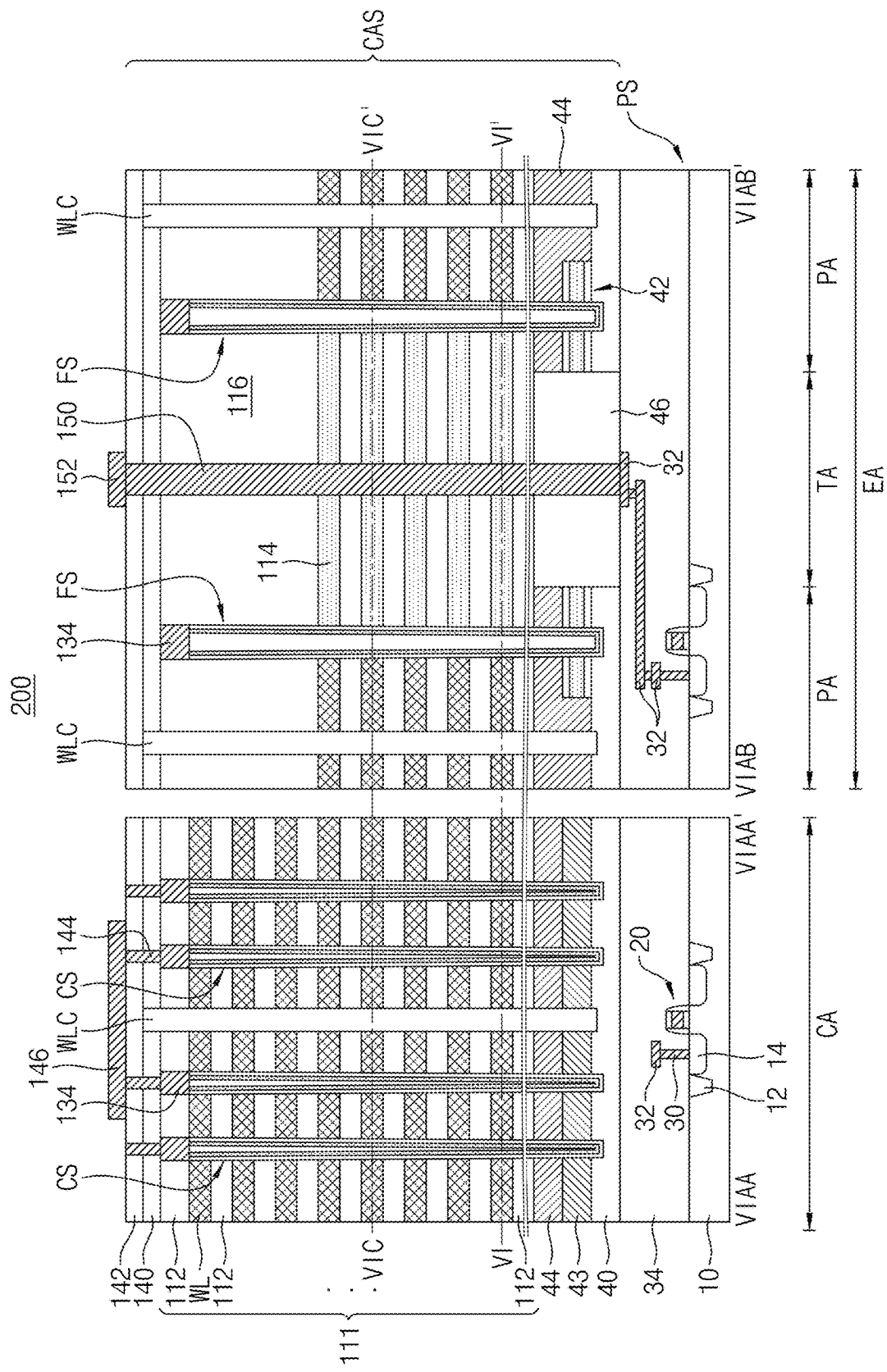

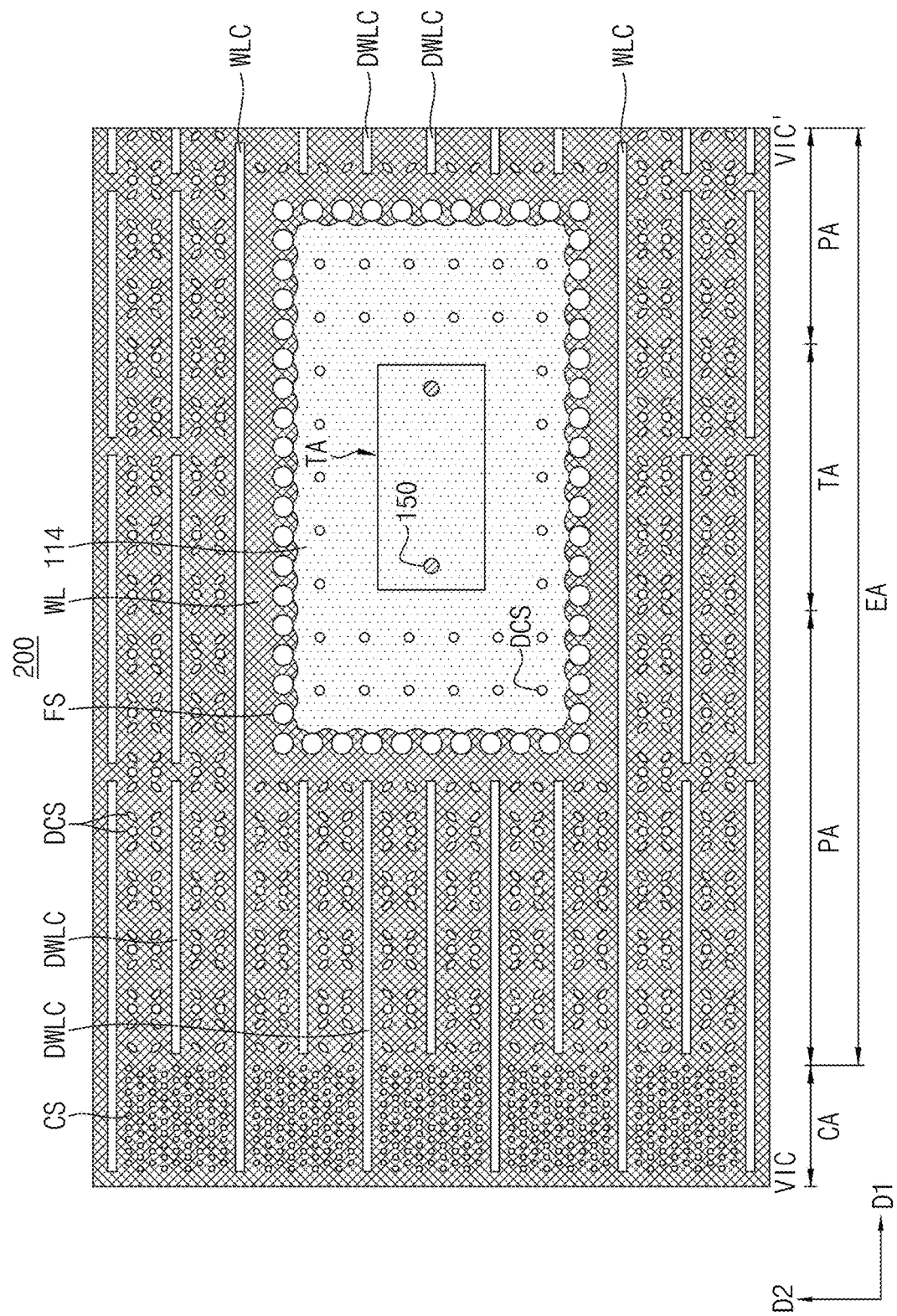

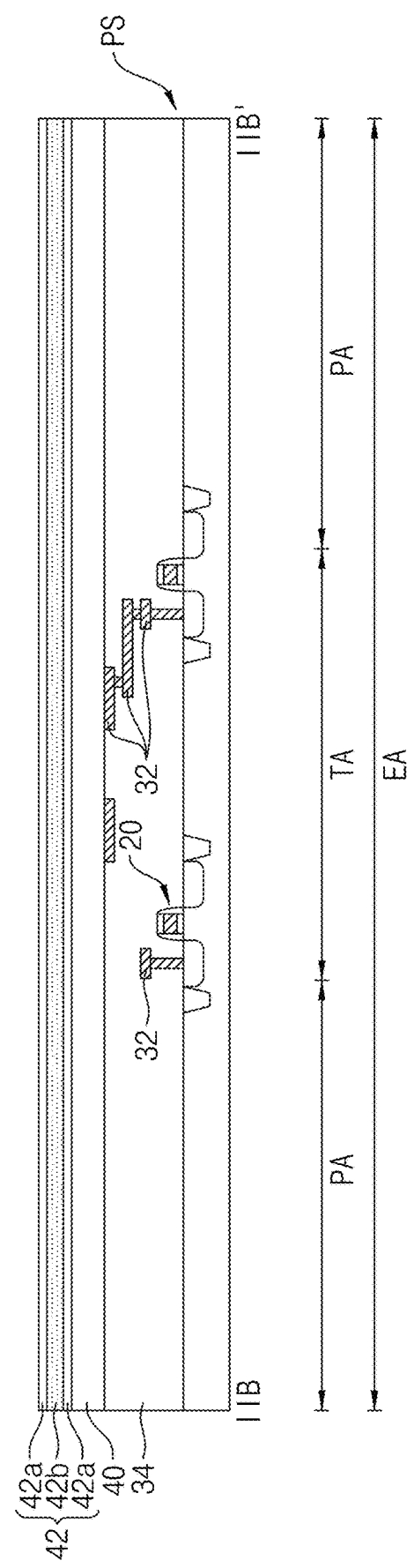

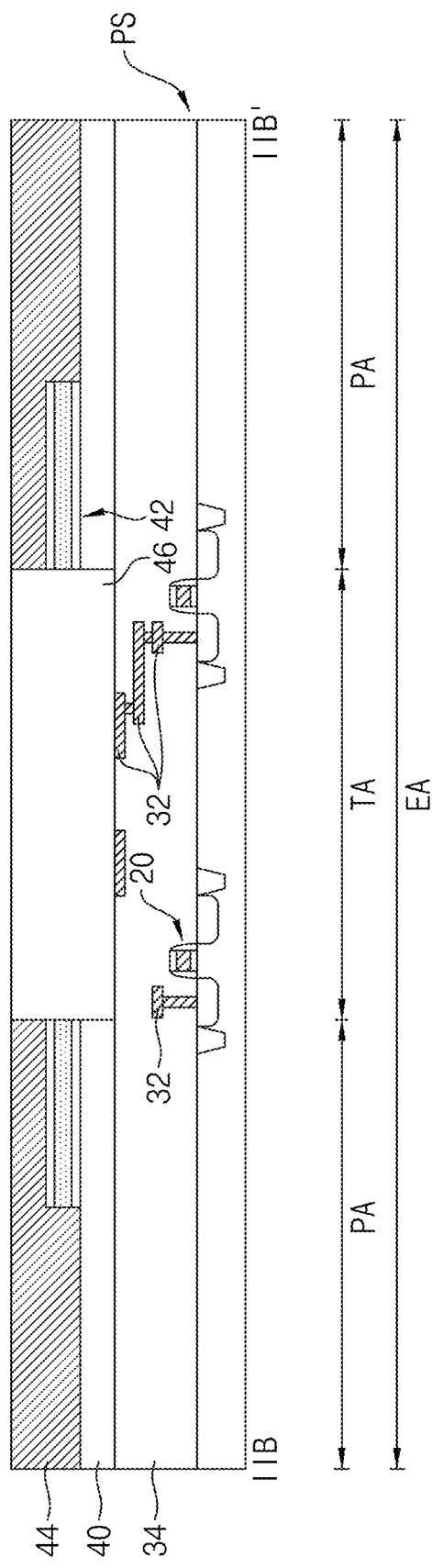

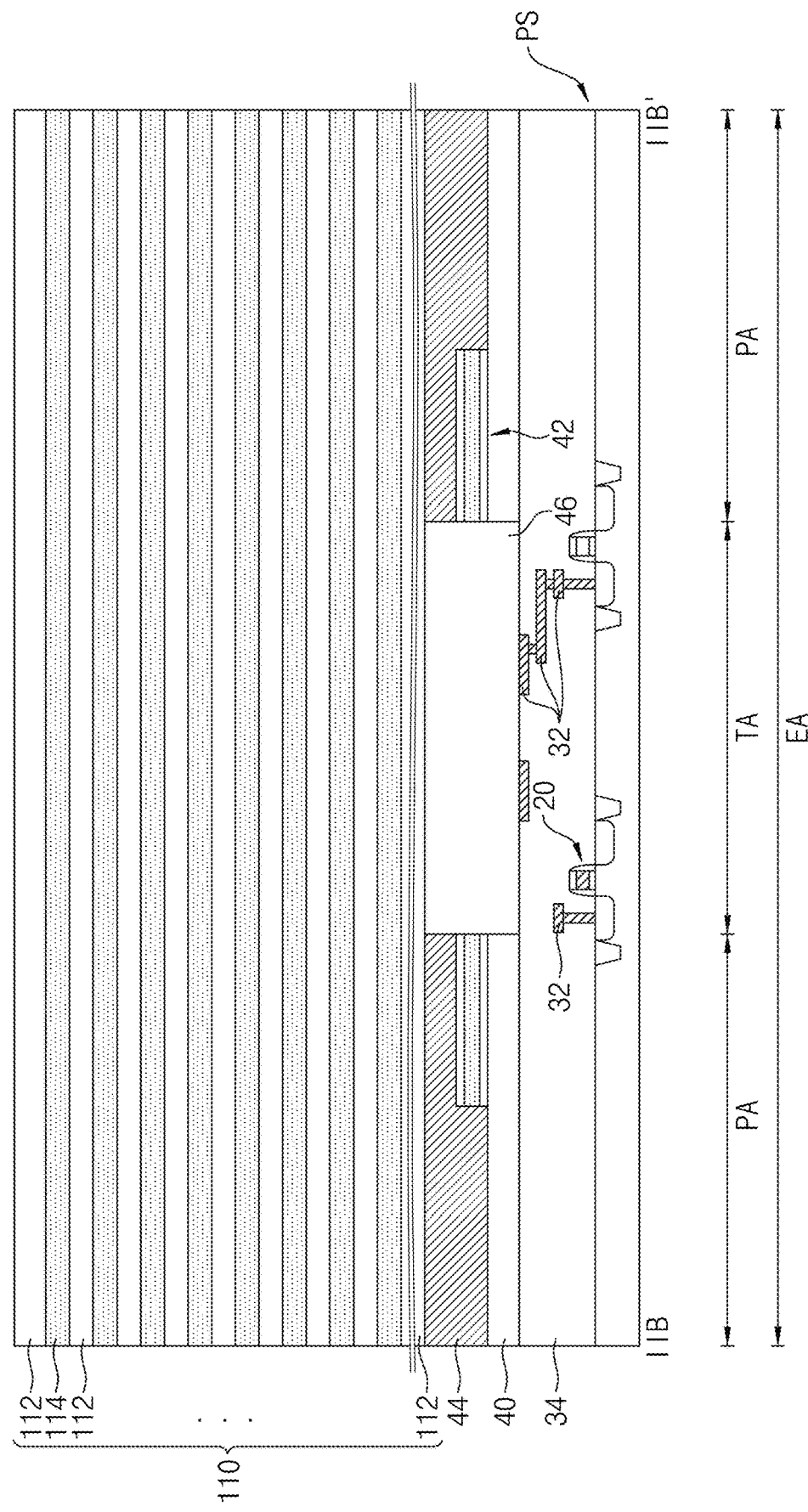

SEMICONDUCTOR DEVICE HAVING VERTICAL FENCE STRUCTURES

CROSS-REFERENCE TO THE RELATED APPLICATION

This U.S. non-provisional application claims priority, under 35 U.S.C. § 119 to Korean Patent Application No. 10-2020-0022332, filed Feb. 24, 2020, the disclosure of which is incorporated herein by reference in its entirety.

BACKGROUND

1. Field

The disclosure relates to semiconductor devices having vertical fence structures.

2. Description of the Related Art

A three-dimensional nonvolatile memory device having a multi-stack structure has been proposed to realize compactness and high integration of electronic products. The nonvolatile memory device includes electrodes, isolation insulating layers, and dummy isolation insulating layers. However, in this technology, it is difficult to dispose the electrode through the isolation insulating layers and the dummy isolation insulating layers.

SUMMARY

Some example embodiments of the disclosure provide semiconductor devices including vertical fence structures.

A semiconductor device in accordance with an example embodiment of the disclosure includes a substrate including a cell array region and an extension region, the extension region extending from the cell array region and including a through electrode region, an electrode stack on the substrate, the electrode stack including mold layers and electrodes alternately stacked, vertical structures penetrating the electrode stack within the cell array region, and vertical fence structures within the extension region and penetrating the electrode stack. The vertical fence structures may surround the through electrode region in a plan view. A distance between adjacent ones of the vertical fence structures may be less than a distance between adjacent ones of the vertical structures.

A semiconductor device in accordance with another example embodiment of the disclosure includes a substrate including a cell array region and an extension region, the extension region extending from the cell array region and including a through electrode region, the through electrode region including through electrodes, an electrode stack on the substrate, the electrode stack including mold layers and electrodes alternately stacked, vertical structures penetrating the electrode stack within the cell array region, and inner vertical fence structures and outer vertical fence structures within the extension region and penetrating the electrode stack. The inner vertical fence structures and the outer vertical fence structures may surround the through electrode region in a plan view. A distance between each of the inner vertical fence structures and a corresponding one of the outer vertical fence structures may be less than a distance between each of the inner vertical fence structures and a corresponding one of the through electrodes. The distance between each of the inner vertical fence structures and a corresponding one of the outer vertical fence structures may be less than the distance between adjacent ones of the vertical structures.

A semiconductor device in accordance with still another example embodiment of the disclosure includes a substrate including a cell array region and an extension region, the extension region extending from the cell array region and including a through electrode region, an electrode stack on the substrate, the electrode stack including mold layers and electrodes alternately stacked, a peripheral circuit structure between the substrate and the electrode stack, a lower conductive layer on the peripheral circuit structure, a connection conductive layer on the lower conductive layer within the cell array region, a connection mold layer on the lower conductive layer within the extension region, a supporter on the connection conductive layer and the connection mold layer, the supporter having the electrode stack thereon, a buried insulating layer in the through electrode region while penetrating the lower conductive layer, the connection mold layer, and the supporter, vertical structures penetrating the electrode stack within the cell array region, vertical fence structures in the extension region while penetrating the electrode stack, the vertical fence structures surrounding the through electrode region in a plan view, and insulating layers being inside a perimeter defined by the vertical fence structures and being at the same level as the electrodes. The electrodes may include first protrusions configured to be in contact with the vertical fence structures in the plan view.

A method of manufacturing a semiconductor device in accordance with an example embodiment of the disclosure may include forming a substrate including a cell array region and an extension region, the extension region including a through electrode region, forming a peripheral circuit structure on the substrate, forming a mold stack including mold layers and insulating layers alternately stacked on the peripheral circuit structure, forming vertical structures penetrating the mold stack within the cell array region, forming vertical fence structures penetrating the mold stack and surrounding the through electrode region within the extension region, forming isolation insulating layers penetrating the mold stack and extending in a first horizontal direction and dummy isolation insulating layers extending in the first horizontal direction between the isolation insulating layers, the isolation insulating layers and the dummy isolation insulating layers being spaced apart from each other in a second horizontal direction intersecting the first horizontal direction, partially removing the insulating layers, and forming electrodes between the mold layers.

BRIEF DESCRIPTION OF THE DRAWINGS

The above and other objects, features, and effects of inventive concepts will become more apparent to those of ordinary skill in the art by describing example embodiments thereof in detail with reference to the accompanying drawings, in which:

FIGS. 6A-6B are vertical cross-sectional views of the semiconductor device shown in FIG. 5, taken along lines VIAA-VIAA', VIAB-VIAB', and, VIB-VIB'.

FIG. 6C is a horizontal cross-sectional view of the semiconductor device shown in FIGS. 6A-6B, taken along line VIC-VIC'.

FIGS. 9A-18B are vertical cross-sectional views illustrating in a process order of a method of manufacturing a semiconductor device according to an example embodiment of inventive concepts.

DETAILED DESCRIPTION

Figure 1:
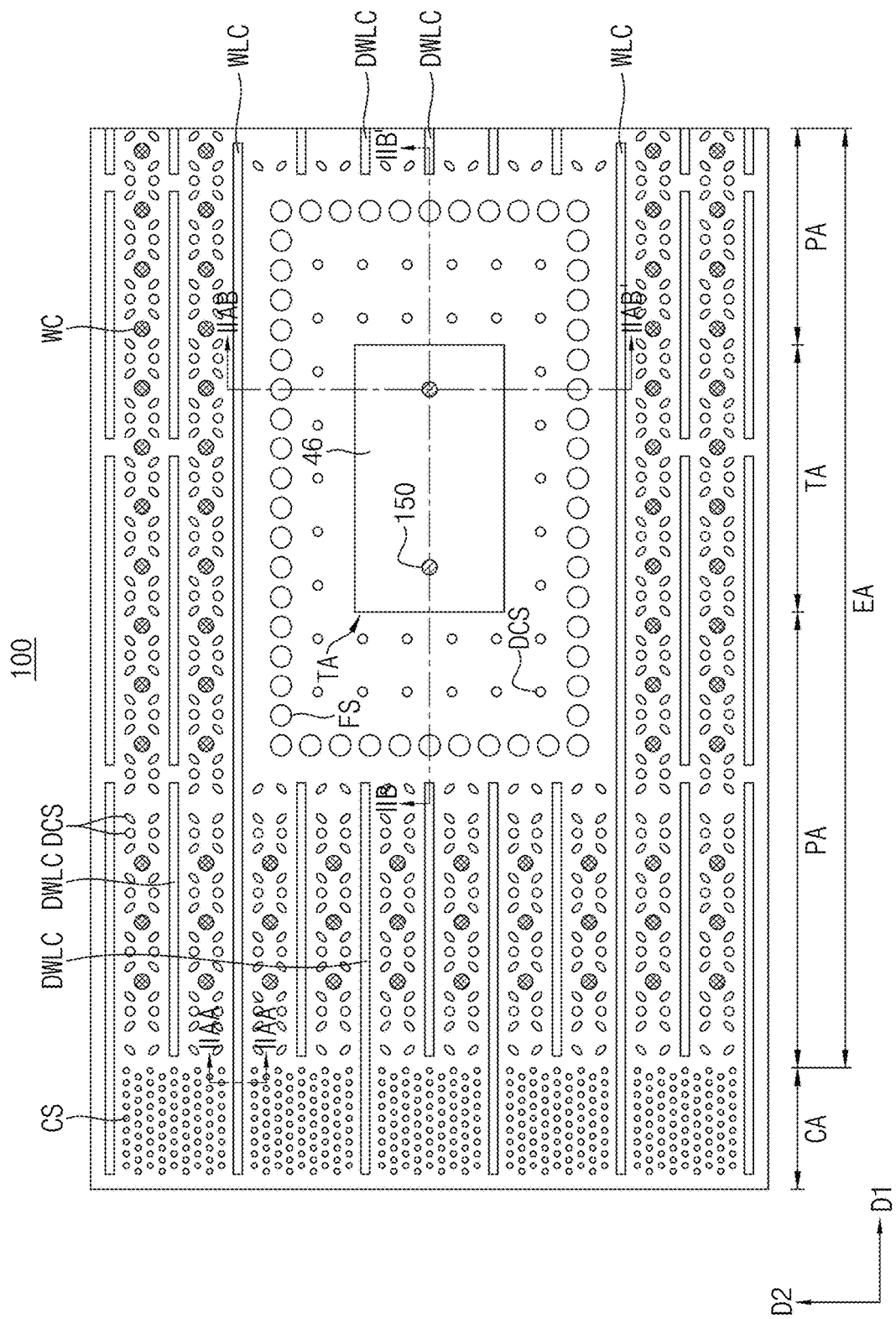
FIG. 1 is a layout of a semiconductor device according to an example embodiment of inventive concepts.
Figure 2A:
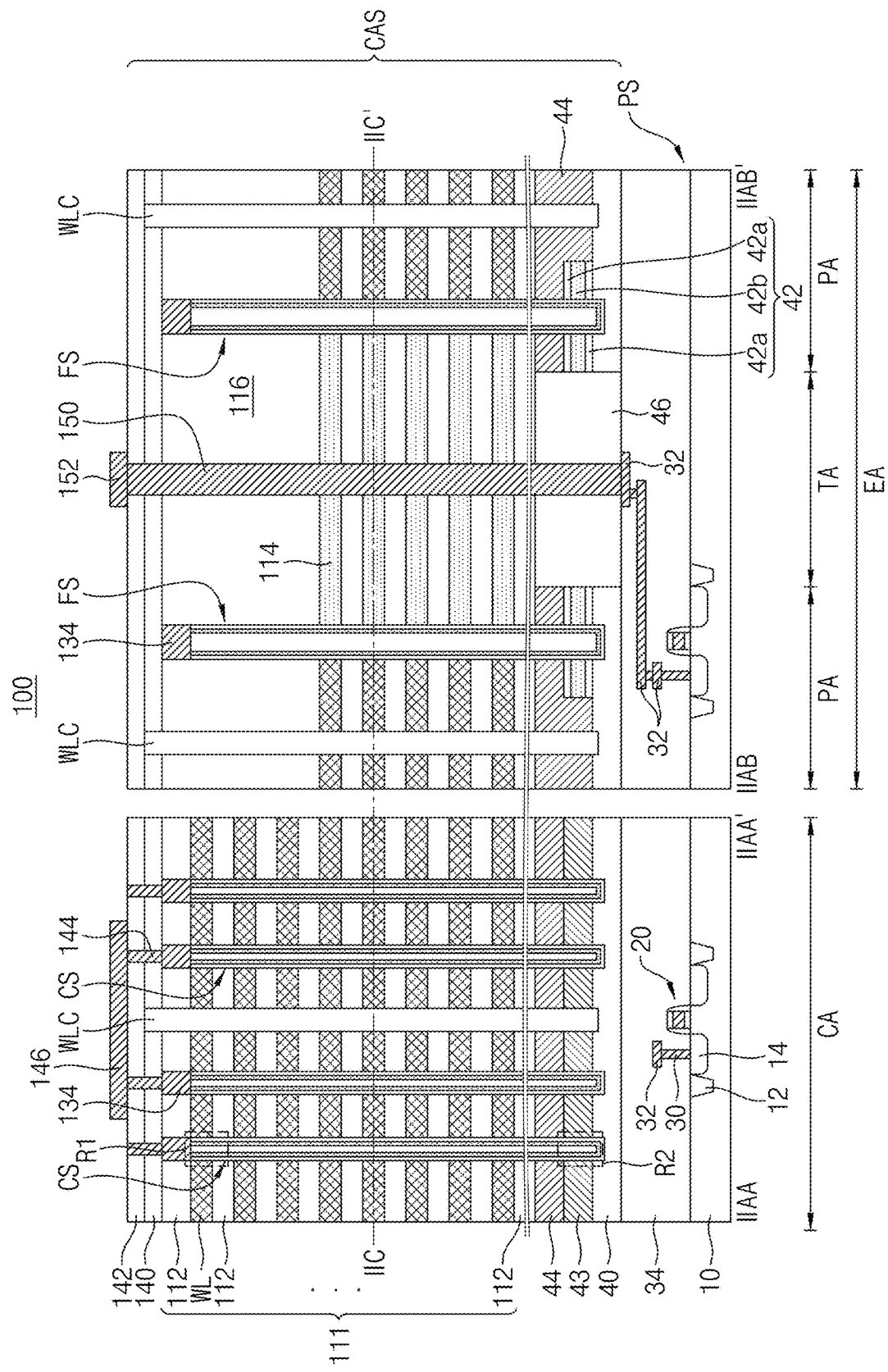
FIGS. 2A-2B are vertical cross-sectional views of the semiconductor device shown in FIG. 1, taken along lines IIAA-IIAA', IIAB-IIAB', and, IIB-IIB'.
Figure 2B:
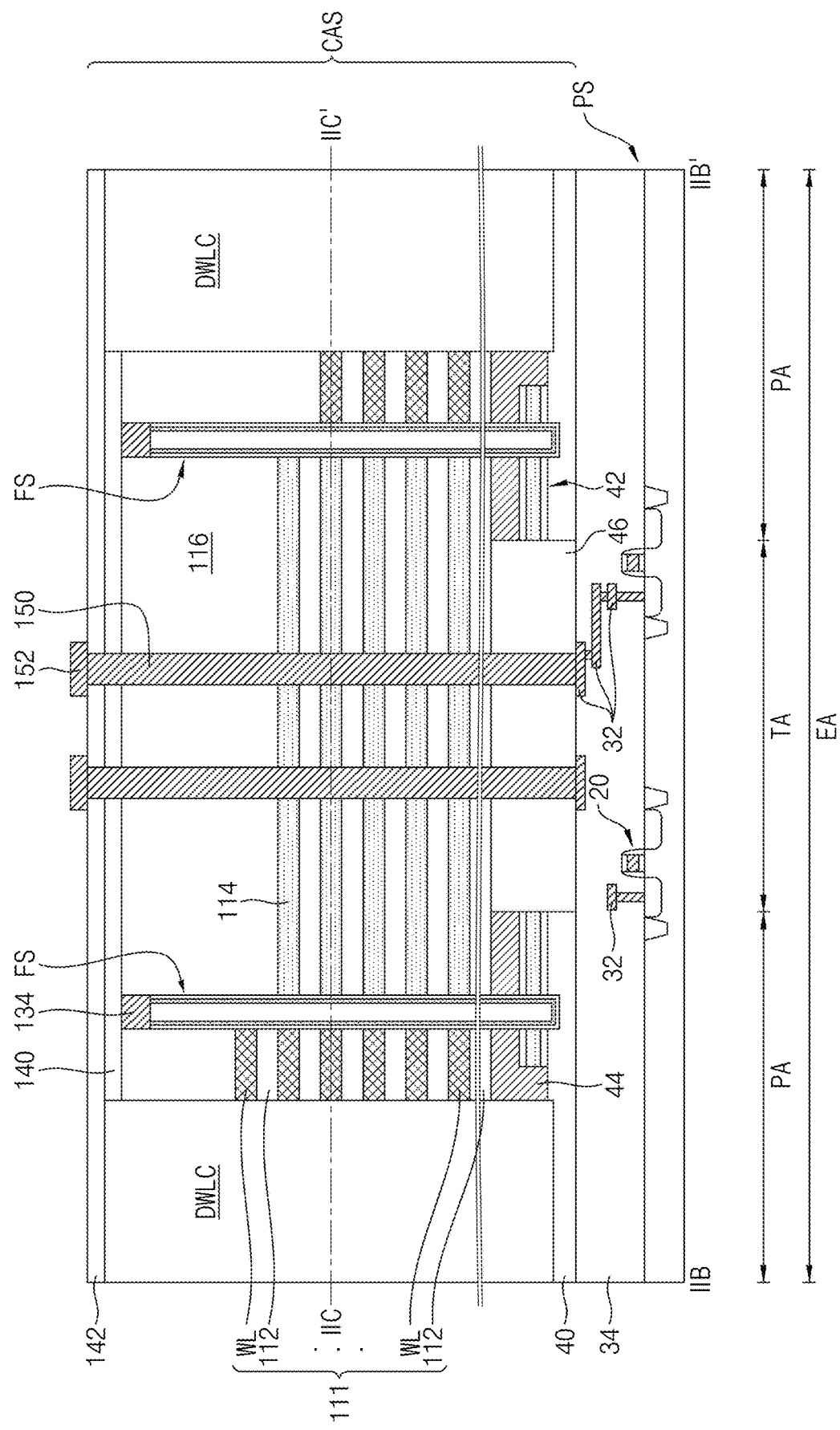
Figure 2C:
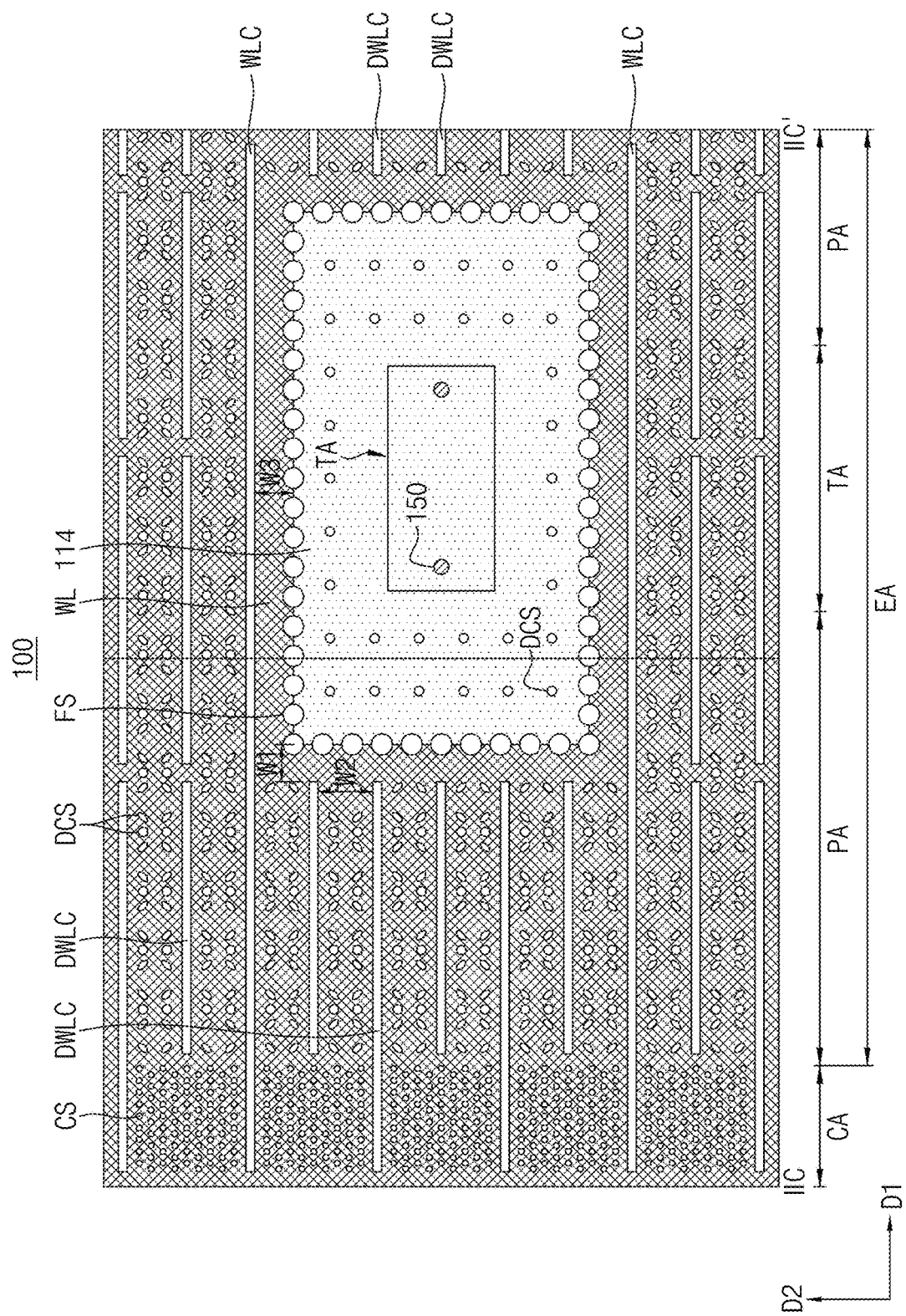
FIG. 2C is a horizontal cross-sectional view of the semiconductor device shown in FIGS. 2A-2B, taken along line IIC-IIC'.

FIG. 1 is a layout of a semiconductor device according to an example embodiment of inventive concepts. FIGS. 2A-2B are vertical cross-sectional views of the semiconductor device shown in FIG. 1, taken along lines IIAA-IIAA', IIAB-IIAB', and, IIB-IIB'. FIG. 2C is a horizontal cross-sectional view of the semiconductor device shown in FIGS. 2A-2B, taken along line IIC-IIC'. A memory device according to the example embodiments of the disclosure may include a flash memory such as a 3D-NAND.

Referring to FIGS. 1, 2A and 2B, a semiconductor device 100 according to an example embodiment of the disclosure may include a cell array region CA and an extension region EA. The extension region EA may include pad regions PA and a through electrode region TA disposed between the pad regions PA.

The cell array region CA may include vertical structures CS. The pad region PA may include dummy vertical structures DCS, vertical fence structures FS, and electrode contacts WC. The through electrode region TA may include a through electrode 150. The through electrode region TA may not include the vertical fence structures FS and the dummy vertical structures DCS.

Isolation insulating layers WLC may be disposed in the cell array region CA and the extension region EA. The isolation insulating layers WLC may extend in a first horizontal direction D1, and may be spaced apart from each other in a second horizontal direction D2. Dummy isolation insulating layers DWLC may be disposed in a portion of the extension region EA. The dummy isolation insulating layers DWLC may extend in the first horizontal direction D1, and may be spaced apart from each other in the second horizontal direction D2. The dummy isolation insulating layers DWLC may be disposed at regular intervals between the isolation insulating layers WLC.

The semiconductor device 100 of the disclosure may have a cell-over-periphery (COP) structure. For example, the semiconductor device 100 may include a peripheral circuit structure PS and a cell array structure CAS disposed on the peripheral circuit structure PS. The peripheral circuit structure PS may be formed on a substrate 10, and may include a device isolation layer 12, an impurity region 14, a transistor 20, a contact plug 30, a peripheral circuit wire 32, and a peripheral insulating layer 34.

The device isolation layer 12 and the impurity region 14 may be disposed on the top surface of the substrate 10. The transistor 20, the contact plug 30, and the peripheral circuit wire 32 may be disposed on the substrate 10. The substrate 10 may include a semiconductor material. For example, the substrate 10 may be one of a silicon substrate, a germanium substrate, a silicon germanium substrate, and a silicon-on-insulator (SOI) substrate. In an example embodiment, the substrate 10 may include one of a group IV semiconductor, a group III-V compound semiconductor, and a group II-VI oxide semiconductor.

The impurity region 14 may be disposed adjacent to the transistor 20. The peripheral insulating layer 34 may cover the transistor 20 and the contact plug 30. The contact plug 30 may be electrically connected to the impurity region 14. The peripheral circuit wire 32 may be connected to the contact plug 30.

The cell array structure CAS may be disposed on the peripheral insulating layer 34. The cell array structure CAS may include an electrode stack 111, an interlayer insulating layer 116, a vertical structure CS, a dummy vertical structure DCS, a vertical fence structure FS, an isolation insulating layer WLC, a dummy isolation insulating layer DWLC, and a through electrode 150. The cell array structure CAS may further include a lower conductive layer 40, an extended mold layer 42, an extended conductive layer 43, a supporter 44, and a buried insulating layer 46, which are disposed below the electrode stack 111.

The lower conductive layer 40 may be disposed on the peripheral circuit structure PS, and may correspond to a common source line (CSL). In an example embodiment, the lower conductive layer 40 may include doped polysilicon. The extended mold layer 42 may be partially disposed on the lower conductive layer 40 within the extension region EA. The extended mold layer 42 may include an insulating layer 42b, and protective layers 42a disposed on the top surface and the bottom surface of the insulating layer 42b. The extended conductive layer 43 may be disposed on the lower conductive layer 40 within the cell array region CA. The supporter 44 may be disposed on the extended mold layer 42 and the extended conductive layer 43, and may be in contact with the top surface of the lower conductive layer 40 around the isolation insulating layer WLC. The buried insulating layer 46 may be disposed on the lower conductive layer 40 within the through electrode region TA. The top surface of the buried insulating layer 46 may be coplanar with the top surface of the supporter 44.

The electrode stack 111 may include a plurality of mold layers 112 and a plurality of electrodes WL, which are alternately stacked on each other. The electrodes WL may include a word line. At least one of the electrodes WL disposed at a lower portion of the electrode stack 111 may be a ground selection line (GSL). At least one of the electrodes WL disposed at an upper portion of the electrode stack 111 may be a string selection line (SSL) or a drain selection line (DSL). The electrode stack 111 may have a staircase structure within the extension region EA. In a region around the through electrode region TA, the electrode stack 111 may include a plurality of insulating layers 114, which are stacked alternately with the plurality of mold layers 112. For example, as illustrated in FIG. 1, the plurality of insulating layers 114 may be disposed inside the vertical fence structures FS (e.g., disposed within a perimeter defined by the vertical fence structures). The plurality of insulating layers 114 may be physically and materially isolated from the electrode WL by the vertical fence structures FS. Each insulating layer 114 may be located at the same level as the electrode WL corresponding thereto. In an example embodiment, the plurality of mold layers 112 may include silicon oxide. The interlayer insulating layer 116 may cover the staircase structure of the electrode stack 111.

The vertical structures CS may extend in the vertical direction while penetrating the extended conductive layer 43, the supporter 44, and the electrode stack 111 within the cell array region CA. The vertical structures CS may be electrically connected to the extended conductive layer 43.

The vertical fence structures FS may extend in the vertical direction while penetrating the extended mold layer 42, the supporter 44, and the electrode stack 111 within the extension region EA. In addition, the vertical fence structures FS may vertically penetrate the interlayer insulating layer 116. Conductive pads 134 may be disposed on the vertical structures CS and the vertical fence structures FS. The vertical fence structure FS and the dummy vertical structure DCS may have a configuration that is the same as or similar to the configuration of the vertical structure CS. The diameters of the vertical fence structures FS may be greater than the diameters of the dummy vertical structures DCS.

The isolation insulating layers WLC and the dummy isolation insulating layers DWLC may vertically penetrate the supporter 44, the electrode stack 111, the interlayer insulating layer 116, and a first upper insulating layer 140, and may be in contact with the lower conductive layer 40. The dummy isolation insulating layers DWLC may be disposed at regular intervals between the isolation insulating layers WLC. The isolation insulating layers WLC and the dummy isolation insulating layers DWLC may extend in the first horizontal direction D1. The dummy isolation insulating layers DWLC may be disposed in a portion of the extension region EA. The vertical fence structures FS may be spaced apart from the dummy isolation insulating layers DWLC in the first horizontal direction D1 and may be disposed between the isolation insulating layers WLC (e.g., an adjacent pair of the isolation insulating layers WLC) in the second horizontal direction D2. That is, the isolation insulating layers WLC and the dummy isolation insulating layers DWLC may not overlap the vertical fence structures FS in a plan view.

The first upper insulating layer 140 may be disposed on the electrode stack 111 and the interlayer insulating layer 116, and a second upper insulating layer 142 may be disposed on the first upper insulating layer 140. A bit line plug 144 may penetrate the first upper insulating layer 140 and the second upper insulating layer 142, and may be connected to the conductive pad 134. A bit line 146 may be disposed on the second upper insulating layer 142, and may be connected to the bit line plug 144.

The through electrode 150 may be disposed within the through electrode region TA. The through electrode 150 may vertically penetrate the buried insulating layer 46, the electrode stack 111, and the interlayer insulating layer 116. A connection wire 152 may be disposed on the through electrode 150. The through electrode 150 may electrically connect the peripheral circuit wire 32 of the peripheral circuit structure PS to the connection wire 152.

FIG. 2C is a horizontal cross-sectional view of the semiconductor device shown in FIGS. 2A-2B, taken along lines IIC-IIC'.

Referring to FIG. 2C, the vertical fence structures FS may be disposed so as to surround the through electrode region TA within the extension region EA. The vertical fence structures FS may be spaced apart from the dummy isolation insulating layers DWLC and may be disposed between the isolation insulating layers WLC. In an example embodiment, the vertical fence structures FS may be disposed at regular intervals, but the disclosure is not limited thereto. In an example embodiment, the vertical fence structures FS may be disposed so as to be in contact with each other.

In a plan view, the electrode WL may be disposed outside the vertical fence structures FS, whereas the dummy vertical structures DCS, the insulating layer 114, and the through electrodes 150 may be disposed inside a perimeter defined by the vertical fence structures FS. The dummy vertical structures DCS may be disposed between the vertical fence structures FS and the through electrode region TA. The diameters of the dummy vertical structures DCS may be different from the diameters of the vertical fence structures FS. The distance between the dummy vertical structures DCS may be different from the distance between the vertical fence structures FS. For example, the distance between the dummy vertical structures DCS may be greater than the distance between the vertical fence structures FS.

The electrode WL may be in contact with the vertical fence structures FS and the insulating layer 42b. The cross-section of the insulating layer 114 may be in contact with the vertical fence structures FS and the electrode WL. In an example embodiment, the distance from the dummy isolation insulating layers DWLC to a side surface of the electrode WL (e.g., a side surface of the electrode WL around the vertical fence structures FS) may be less than the distance between the dummy isolation insulating layers DWLC. For example, the maximum distance W1 along the first horizontal direction D1 from the dummy isolation insulating layers DWLC to a side surface of the electrode WL (e.g., a side surface of the electrode WL around the vertical fence structures FS) may be less than or equal to ½ of the distance W2 between adjacent ones of the dummy isolation insulating layers DWLC. The maximum distance W3 along the second horizontal direction D2 from the isolation insulating layers WLC to the cross-section of the electrode WL (e.g., to a side surface of the electrode WL that is provided around the vertical fence structures FS) may be less than or equal to ½ of the distance W2 between adjacent ones of the dummy isolation insulating layers DWLC.

Figure 2D:
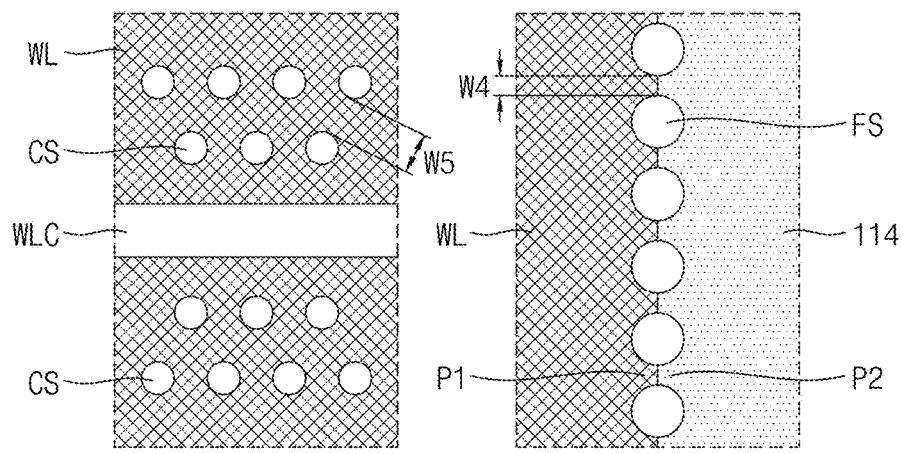
FIG. 2D shows enlarged views of portions of FIG. 2D.

FIG. 2D shows enlarged views of portions of FIG. 2C.

Referring to FIG. 2D, in an example embodiment, a portion of the electrode WL may include first protrusions P1 protruding toward the insulating layer 114. In an example embodiment, the cross-section of the insulating layer 114 may include second protrusions P2 protruding toward the electrode WL. The first protrusions P1 and the second protrusions P2 may protrude so as to face each other between the vertical fence structures FS. In an example embodiment, the first protrusions P1 and the second protrusions P2 may be in contact with each other between the vertical fence structures FS. The vertical fence structures FS may be disposed more densely than the vertical structures CS. For example, the minimum distance between the vertical fence structures FS may be less than the minimum distance between the vertical structures CS. In an example embodiment, the distance W4 between the vertical fence structures FS may be less than the distance W5 between the vertical structures CS. For example, the distance W4 between the vertical fence structures FS may be less than ½ of the distance W5 between the vertical structures CS. Here, the distance W4 between the vertical fence structures FS may be the distance between the side surfaces of two adjacent ones of the vertical fence structures FS, and the distance W5 between the vertical structures CS may be the distance between the side surfaces of two adjacent ones of the vertical structures CS.

In an example embodiment, the diameters of the vertical fence structures FS may be greater than or equal to the diameters of the dummy vertical structures DCS, and the diameters of the dummy vertical structures DCS may be greater than or equal to the diameters of the vertical structures CS. For example, the ratio of the diameters of the dummy vertical structures DCS to the diameters of the vertical structures CS may be 1:1 to 1:2. The ratio of the diameters of the vertical fence structures FS to the diameters of the vertical structures CS may be 1:1 to 1:4. In an example embodiment, the ratio of the diameters of the dummy vertical structures DCS to the diameters of the vertical structures CS may be 1:1.2 to 1:1.5, and the ratio of the diameters of the vertical fence structures FS to the diameters of the vertical structures CS may be 1:1.2 to 1:2.4. In an example embodiment, the ratio of the diameters of the dummy vertical structures DCS to the diameters of the vertical structures CS may be 1:1.4, and the ratio of the diameters of the vertical fence structures FS to the diameters of the vertical structures CS may be 1:1.4.

Figure 3:
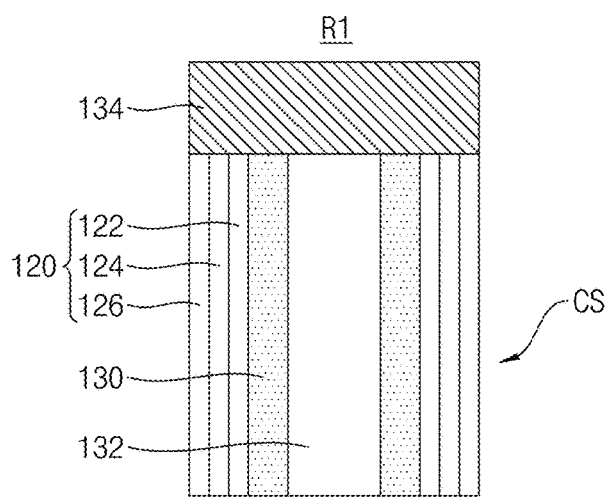
FIGS. 3-4 are enlarged views of portions of the semiconductor device shown in FIG. 2A.
Figure 4:
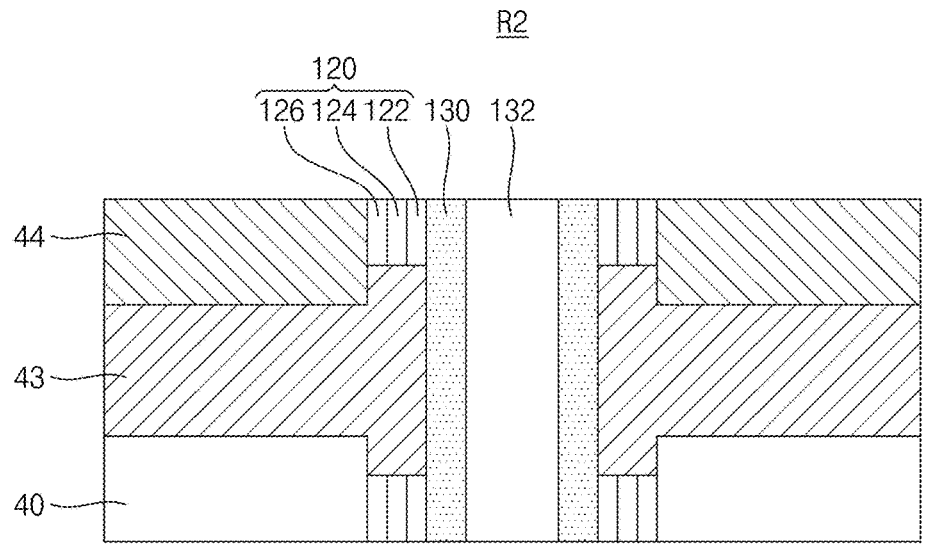

FIGS. 3-4 are enlarged views of portions of the semiconductor device shown in FIG. 2A.

Referring to FIG. 3, the vertical structure CS may include an information storage layer 120, a channel layer 130, and a buried insulating pattern 132. The channel layer 130 may be disposed inside the information storage layer 120, and the buried insulating pattern 132 may be disposed inside the channel layer 130. The information storage layer 120 may include a tunnel insulating layer 122, a charge storage layer 124, and a blocking layer 126. The tunnel insulating layer 122 may be disposed inside the charge storage layer 124, and the charge storage layer 124 may be disposed inside the blocking layer 126. In an example embodiment, the channel layer 130 may include polysilicon. The buried insulating pattern 132 may include silicon oxide, silicon nitride, silicon oxynitride, or combinations thereof. In an example embodiment, the blocking layer 122 and the tunnel insulating layer 126 may include silicon oxide, and the charge storage layer 124 may include silicon nitride. The vertical fence structure FS and the dummy vertical structure DCS may have the same or substantially similar structure as the vertical structure CS. For example, the vertical fence structure FS may include the information storage layer 120, the channel layer 130, and the buried insulating pattern 132.

Referring to FIG. 4, the extended conductive layer 43 may penetrate the information storage layer 120, and may be in contact with the side surface of the channel layer 130. The portion of the extended conductive layer 43 that is in contact with the channel layer 130 may extend in the vertical direction.

Figure 5:
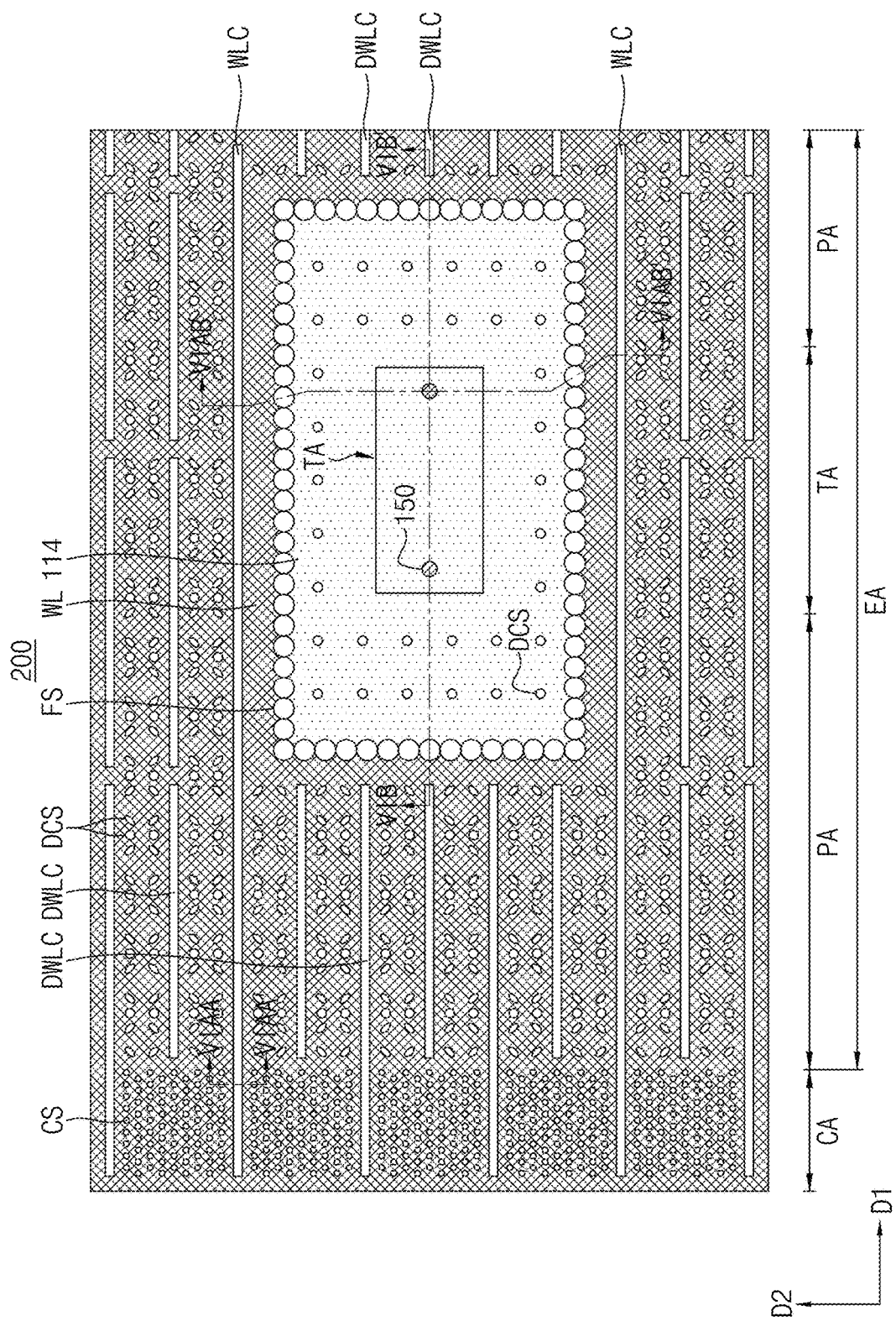
FIG. 5 is a horizontal cross-sectional view of a semiconductor device according to an example embodiment of inventive concepts.
Figure 6B:
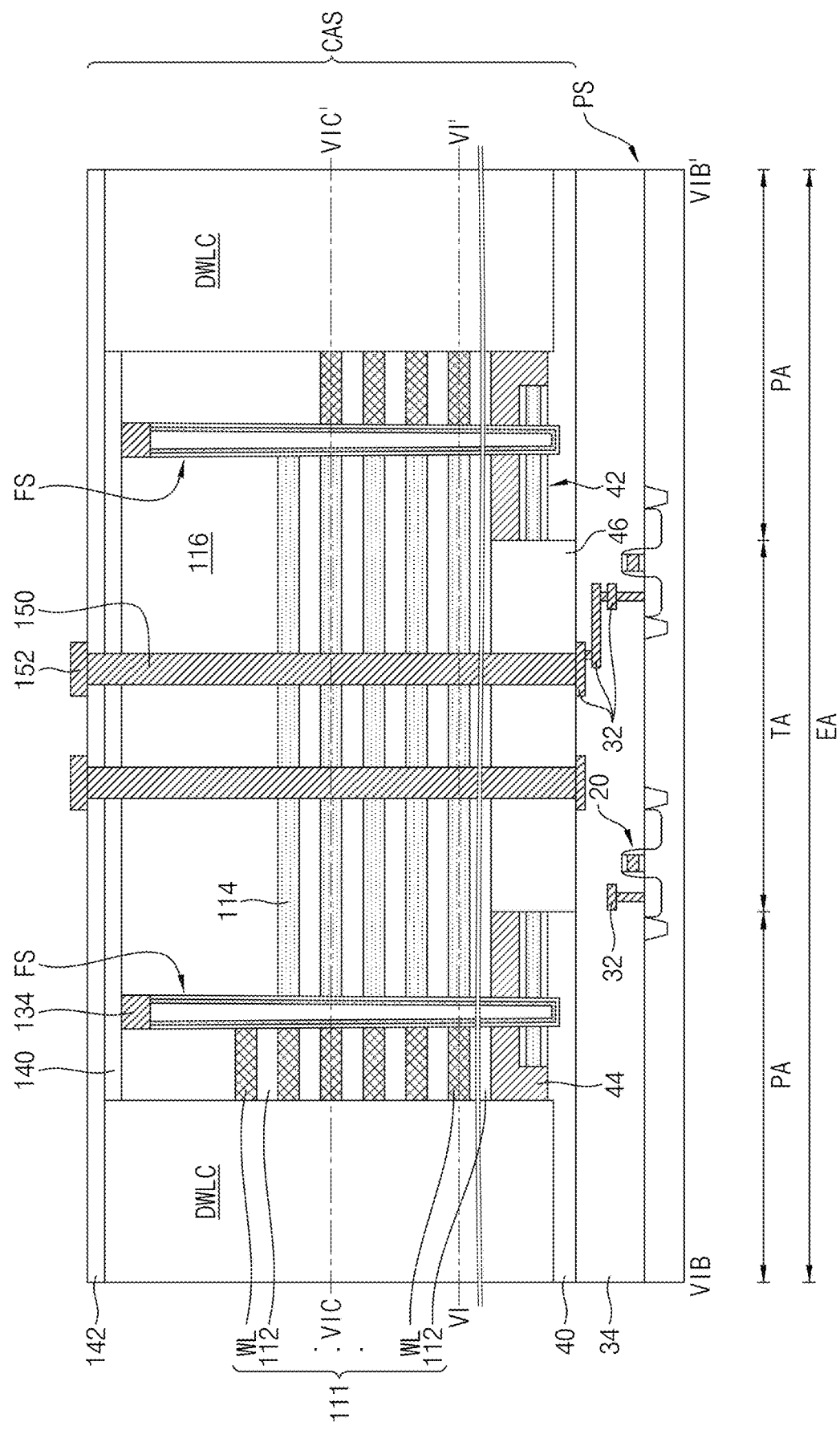

FIG. 5 is a horizontal cross-sectional view of a semiconductor device according to an example embodiment of inventive concepts. FIGS. 6A-6B are vertical cross-sectional views of the semiconductor device shown in FIG. 5, taken along lines VIAA-VIAA', VIAB-VIAB', and, VIB-VIB'. FIG. 6C is a horizontal cross-sectional view of the semiconductor device shown in FIGS. 6A-6B, taken along lines VIC-VIC'. FIG. 6C is a horizontal cross-sectional view of the lowermost layer of an electrode stack 111, and illustrates vertical fence structures FS, an electrode WL, and an insulating layer 114 in the lowermost layer.

Referring to FIGS. 5, 6A and 6B, a semiconductor device 200 may include vertical fence structures FS surrounding a through electrode region TA. In an example embodiment, the vertical fence structures FS may be disposed such that the side surfaces thereof are in contact with each other, and the electrode WL and the insulating layer 114 may not be in direct contact with each other. In a plan view, the horizontal lengths of the vertical fence structures FS may be greater than the contact lengths between adjacent ones of the vertical fence structures FS. In other words, the horizontal lengths of the vertical fence structures FS may be set such that each of an adjacent pair of the vertical fence structures FS are connected to each other.

In a longitudinal sectional view, the vertical structures CS and the vertical fence structures FS may have a tapered shape. For example, the horizontal widths of the vertical structures CS and the vertical fence structures FS may gradually decrease from the upper portion of the device to the lower portion of the device. In a longitudinal sectional view, the horizontal distance from the dummy isolation insulating layer DWLC to the vertical fence structures FS may gradually increase from the upper portion of the device to the lower portion of the device.

Referring to FIG. 6C, the side surfaces of the vertical fence structures FS may not be in direct contact with each other below the electrode stack 111. The lowermost electrode WL may be in contact with the lowermost insulating layer 114. The cross-section (e.g., a side surface) of the lowermost electrode WL may be located inside a perimeter defined by the vertical fence structures FS, but the disclosure is not limited thereto. The maximum distance along the first horizontal direction D1 from the dummy isolation insulating layers DWLC to the cross-section of the lowermost electrode WL may be less than or equal to ½ of the distance between adjacent ones of the dummy isolation insulating layers DWLC. The maximum distance along the second horizontal direction from the isolation insulating layers WLC to the cross-section (e.g., a side surface) of the lowermost electrode WL may be less than or equal to ½ of the distance between adjacent ones of the dummy isolation insulating layers DWLC.

Figure 7:
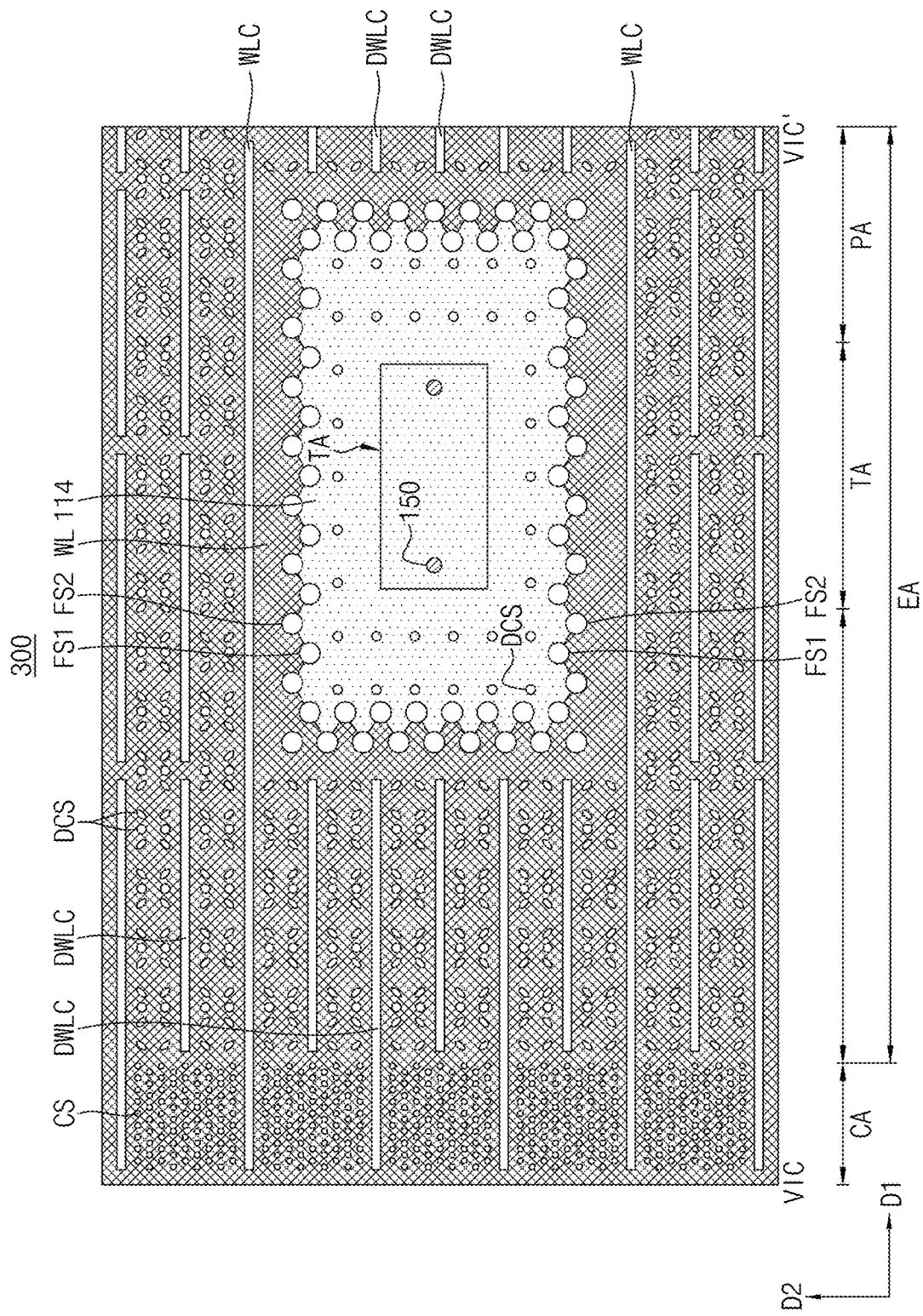
FIGS. 7-8 are horizontal cross-sectional views of semiconductor devices according to example embodiments of inventive concepts.
Figure 8:
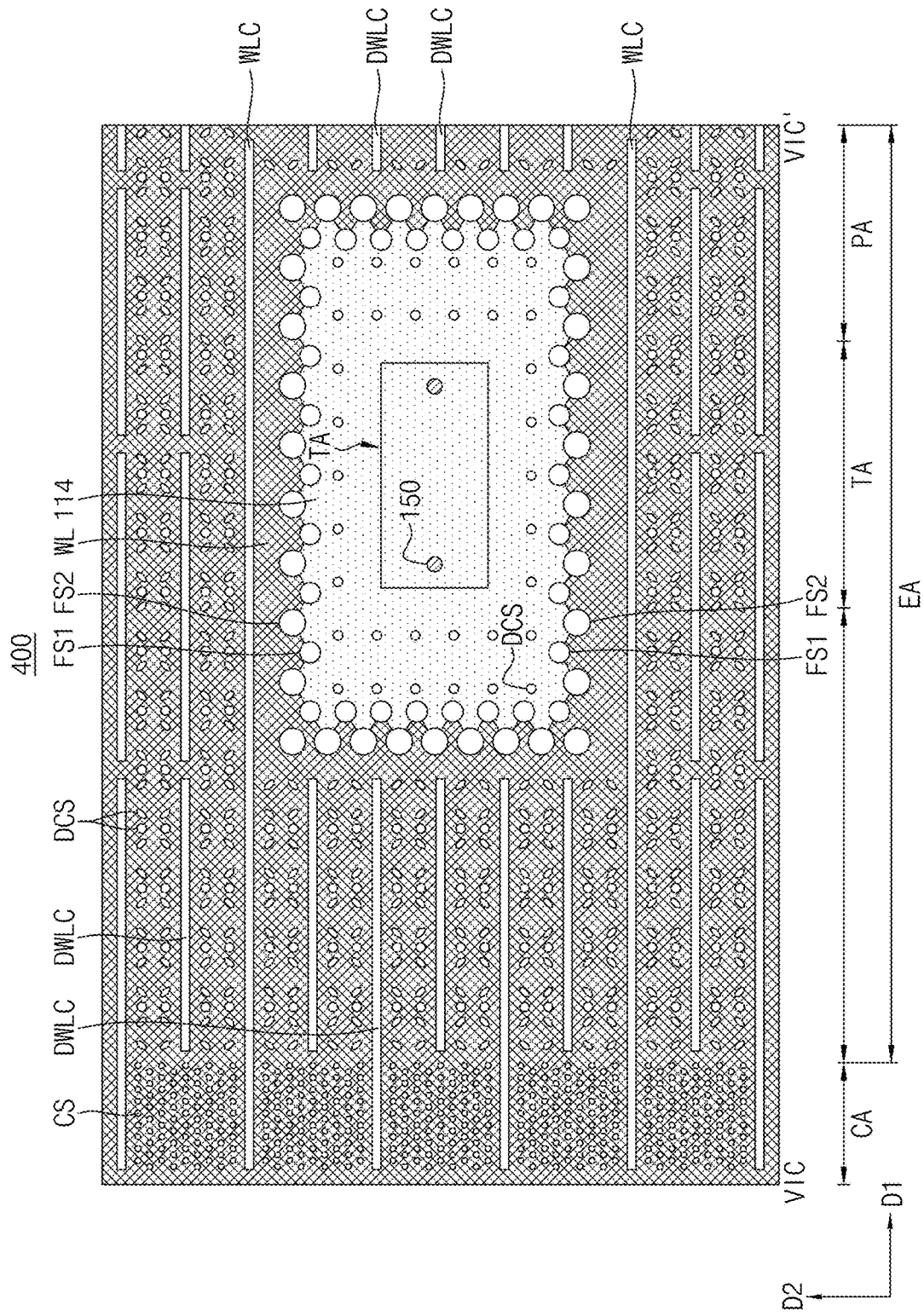

FIGS. 7-8 are horizontal cross-sectional views of semiconductor devices according to example embodiments of inventive concepts.

Referring to FIG. 7, a semiconductor device 300 may include inner vertical fence structures FS1 and outer vertical fence structures FS2 surrounding the through electrode region TA. The outer vertical fence structures FS2 may be disposed outside the inner vertical fence structures FS1. The inner vertical fence structures FS1 may be spaced apart from each other along the perimeter (or circumference) of the through electrode region TA, and the outer vertical fence structures FS2 may be spaced apart from each other along the perimeter (or circumference) of the through electrode region TA. In an example embodiment, the inner vertical fence structures FS1 and the outer vertical fence structures FS2 may be arranged in a zigzag form. For example, a corresponding one of the inner vertical fence structures FS2 may be disposed between two adjacent ones of the outer vertical fence structures FS1.

The cross-section (e.g., a side surface) of the electrode WL may be disposed between the inner vertical fence structures FS1 and the outer vertical fence structures FS2. The cross-section of the electrode WL may be in contact with the inner vertical fence structures FS1, but the disclosure is not limited thereto. In an example embodiment, the cross-section of the electrode WL may not be in contact with the inner vertical fence structures FS1.

A distance between each of the inner vertical fence structures FS1 and a corresponding one of the outer vertical fence structures FS2 may be less than a distance between each of the inner vertical fence structures FS1 and the through electrodes 150. Further, a distance between each of the inner vertical fence structures FS1 and a corresponding one of the outer vertical fence structures FS2 may be less than a distance between the vertical structures CS.

Referring to FIG. 8, a semiconductor device 400 may include inner vertical fence structures FS1 and outer vertical fence structures FS2 surrounding the through electrode region TA. The diameters of the inner vertical fence structures FS1 may be different from the diameters of the outer vertical fence structures FS2. In an example embodiment, the diameters of the outer vertical fence structures FS2 may be greater than the diameters of the inner vertical fence structures FS1. In an example embodiment, the diameters of the outer vertical fence structures FS2 may be less than the diameters of the inner vertical fence structures FS1.

FIGS. 9A-18B are vertical cross-sectional views illustrating in a process order of a method of manufacturing a semiconductor device according to an example embodiment of inventive concepts. FIGS. 9A, 10A, 11A, 12A, 13A, 14A, 15A, 16A, 17A and 18A are vertical cross-sectional views taken along lines IIAA-IIAA and IIAB-IIAB' in FIG. 1, and FIGS. 9B, 10B, 11B, 12B, 13B, 14B, 15B, 16B, 17B and 18B are vertical cross-sectional views taken along line IIB-IIB' in FIG. 1.

Figure 9A:
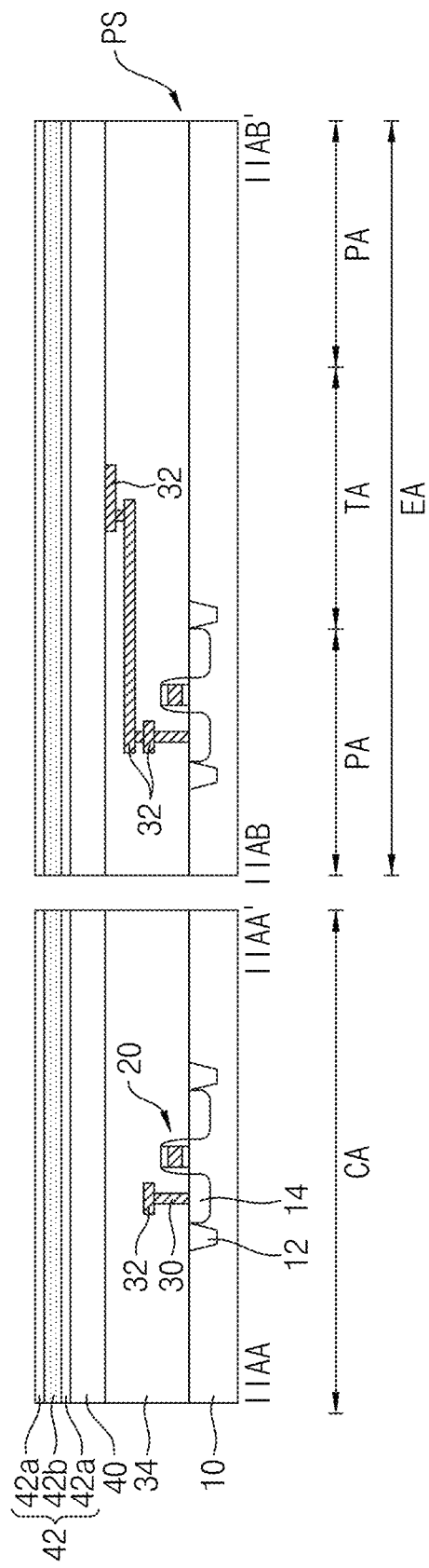

Referring to FIGS. 9A and 9B, a method of manufacturing the semiconductor device 100 may include forming a peripheral circuit structure PS on a substrate 10, forming a lower conductive layer 40 on the peripheral circuit structure PS, and forming an extended mold layer 42 on the lower conductive layer 40. The peripheral circuit structure PS may include a device isolation layer 12, an impurity region 14, a transistor 20, a contact plug 30, a peripheral circuit wire 32, and a peripheral insulating layer 34. The device isolation layer 12 and the impurity region 14 may be formed on the top surface of the substrate 10. In an example embodiment, the device isolation layer 12 may include an insulating material such as silicon oxide or silicon nitride. The impurity region 14 may include an n-type impurity. The transistor 20 may be disposed adjacent to the impurity region 14. The peripheral circuit wire 32 may be disposed on the contact plug 30, and may be connected to the impurity region 14 via the contact plug 30. The peripheral insulating layer 34 may cover the transistor 20, the contact plug 30, and the peripheral circuit wire 32.

The lower conductive layer 40 may include metal, metal nitride, metal silicide, metal oxide, conductive carbon, polysilicon, or combinations thereof. In an example embodiment, the lower conductive layer 40 may include a doped polysilicon layer. The extended mold layer 42 may include an insulating layer 42b and protective layers 42a disposed on the top surface and the bottom surface of the insulating layer 42b. The extended mold layer 42 may include a material having etch selectivity with respect to the lower conductive layer 40, and the protective layer 42a may include a material having etch selectivity with respect to the insulating layer 42b. In an example embodiment, the protective layer 42a may include silicon oxide and the insulating layer 42b may include silicon nitride.

Figure 10A:
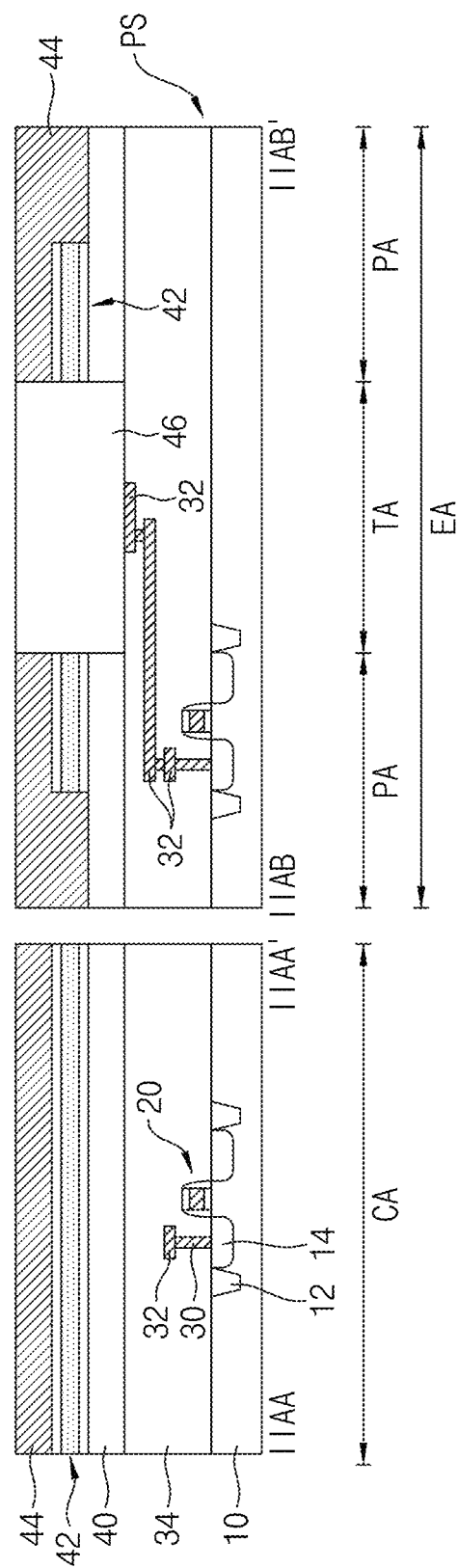

Referring to FIGS. 10A and 10B, the method may include partially removing the extended mold layer 42, forming a supporter 44 on the lower conductive layer 40, and forming a buried insulating layer 46 on the peripheral circuit structure PS. Within an extension region EA, the extended mold layer 42 may be partially removed through a patterning process, and the top surface of the lower conductive layer 40 may be partially exposed. The supporter 44 may be formed to cover the exposed portion of the lower conductive layer 40 and the extended mold layer 42. In an example embodiment, the supporter 44 may include polysilicon.

Within a through electrode region TA, the lower conductive layer 40, the extended mold layer 42, and the supporter 44 may be partially removed, and the top surface of the peripheral insulating layer 34 of the peripheral circuit structure PS may be partially exposed. The buried insulating layer 46 may be formed to cover the exposed portion of the peripheral insulating layer 34. The forming the buried insulating layer 46 may include performing a deposition process and a planarization process. The top surface of the buried insulating layer 46 may be coplanar with the top surface of the supporter 44.

Figure 11A:
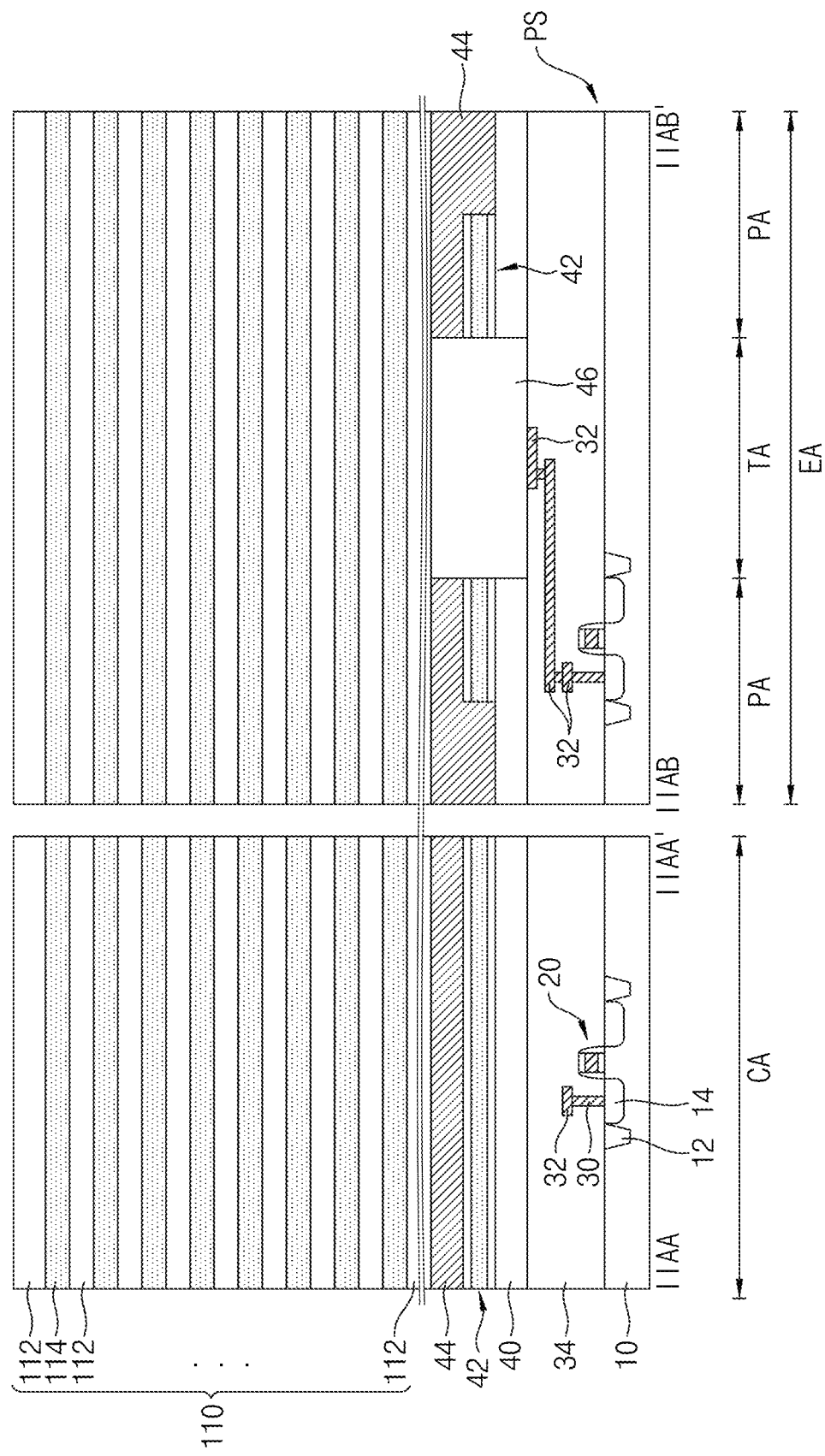

Referring to FIGS. 11A and 11B, the method may include forming a mold stack 110. The forming the mold stack 110 may include performing a deposition process. The mold stack 110 may include a plurality of mold layers 112 and a plurality of insulating layers 114, which are alternately stacked on each other. In an example embodiment, the mold layer 112 may include silicon oxide, and the insulating layer 114 may include silicon nitride.

Figure 12A:
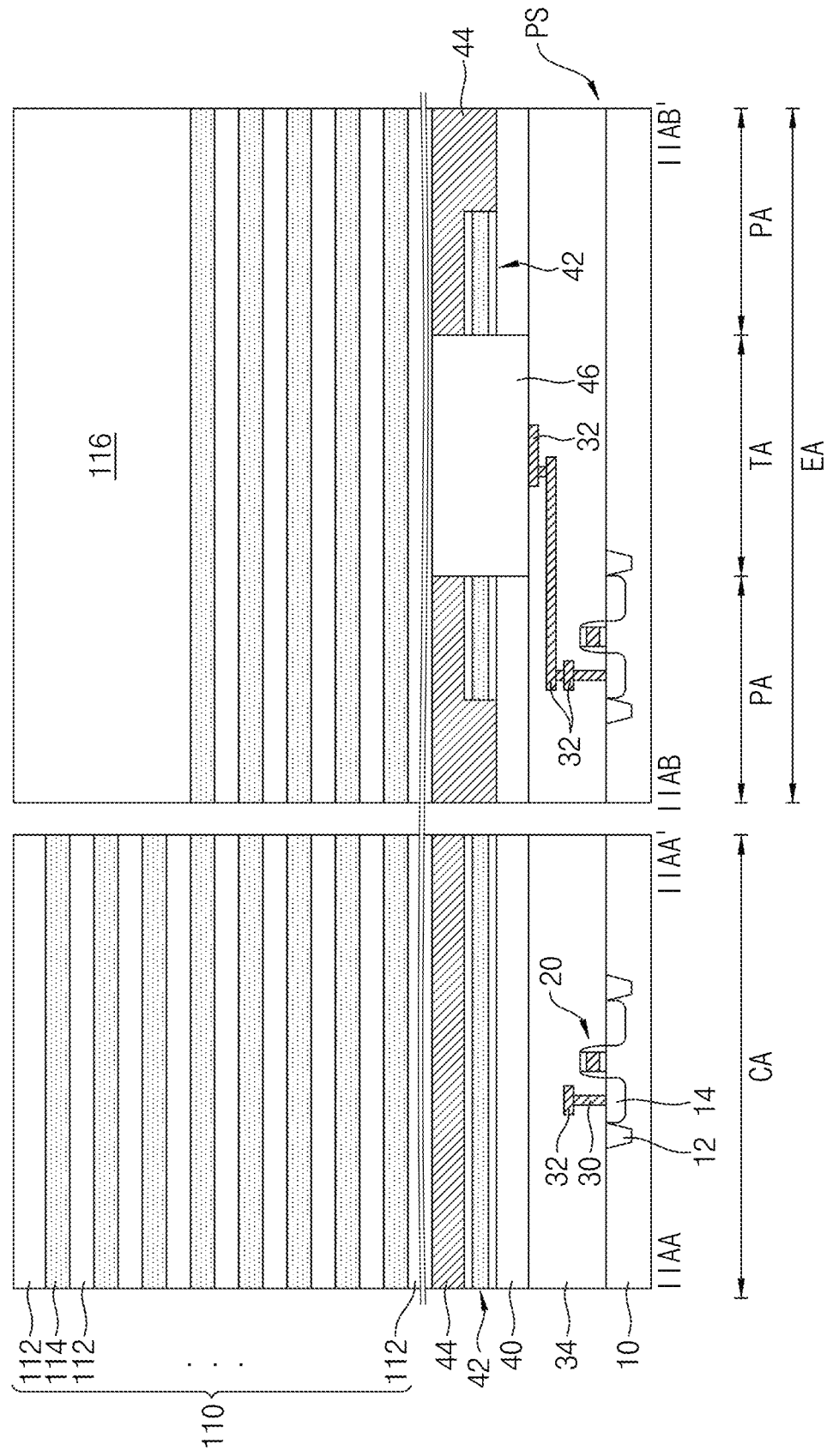
Figure 12B:
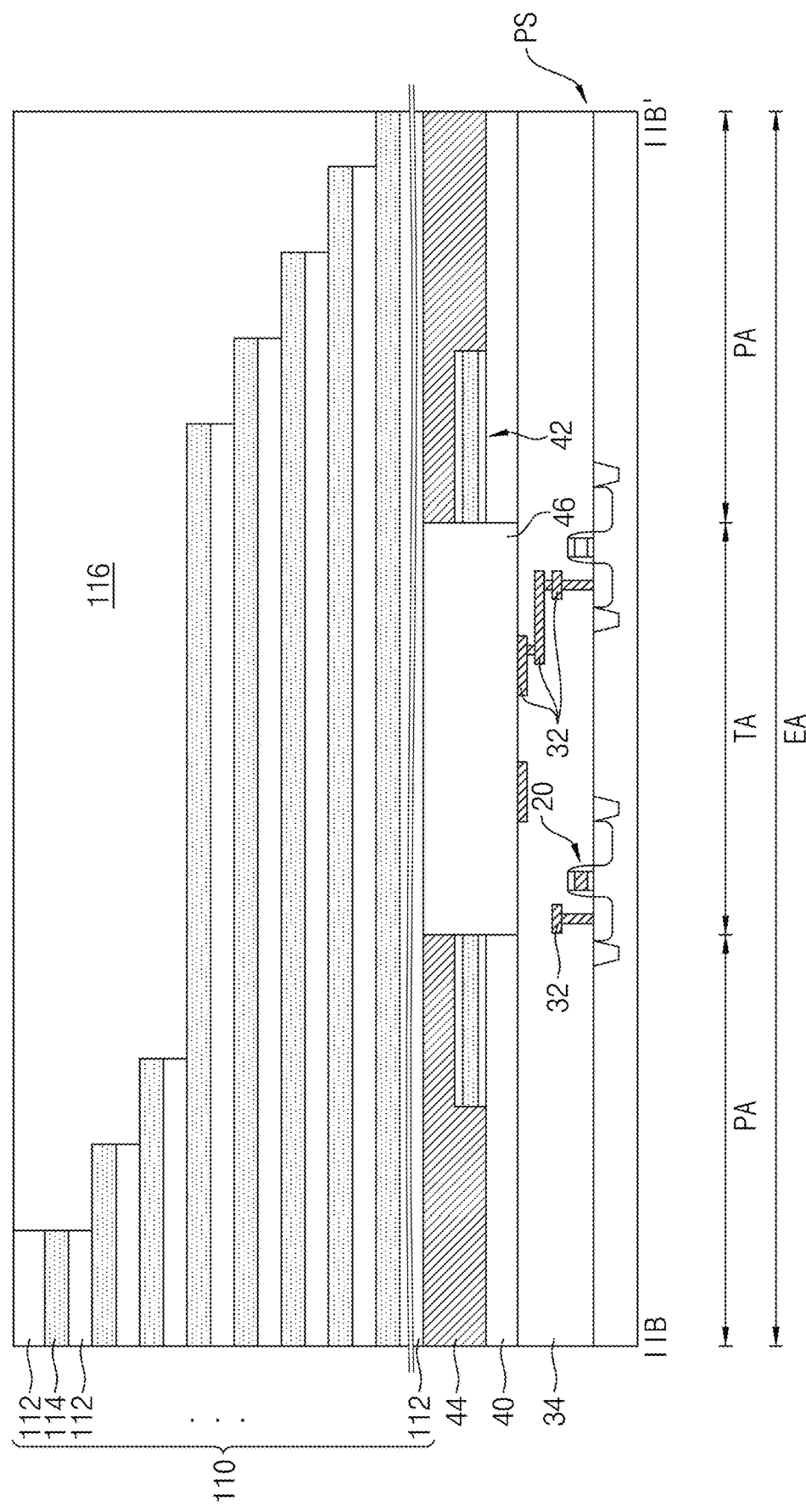

Referring to FIGS. 12A and 12B, the method may include trimming the mold stack 110 and forming an interlayer insulating layer 116. The mold stack 110 may have a staircase structure formed through the trimming process within the extension region EA. In an example embodiment, the extension region EA may include a through electrode region TA formed between the pad regions PA. The mold stack 110 may have a staircase structure in the pad region PA, and may have a flat shape rather than a staircase structure in the through electrode region TA.

The interlayer insulating layer 116 may cover the mold stack 110 within the extension region EA. The interlayer insulating layer 116 may include silicon oxide, silicon nitride, silicon oxynitride, a low-k dielectric material, a high-k dielectric material, or combinations thereof. In an example embodiment, the interlayer insulating layer 116 may include silicon oxide.

Figure 13A:
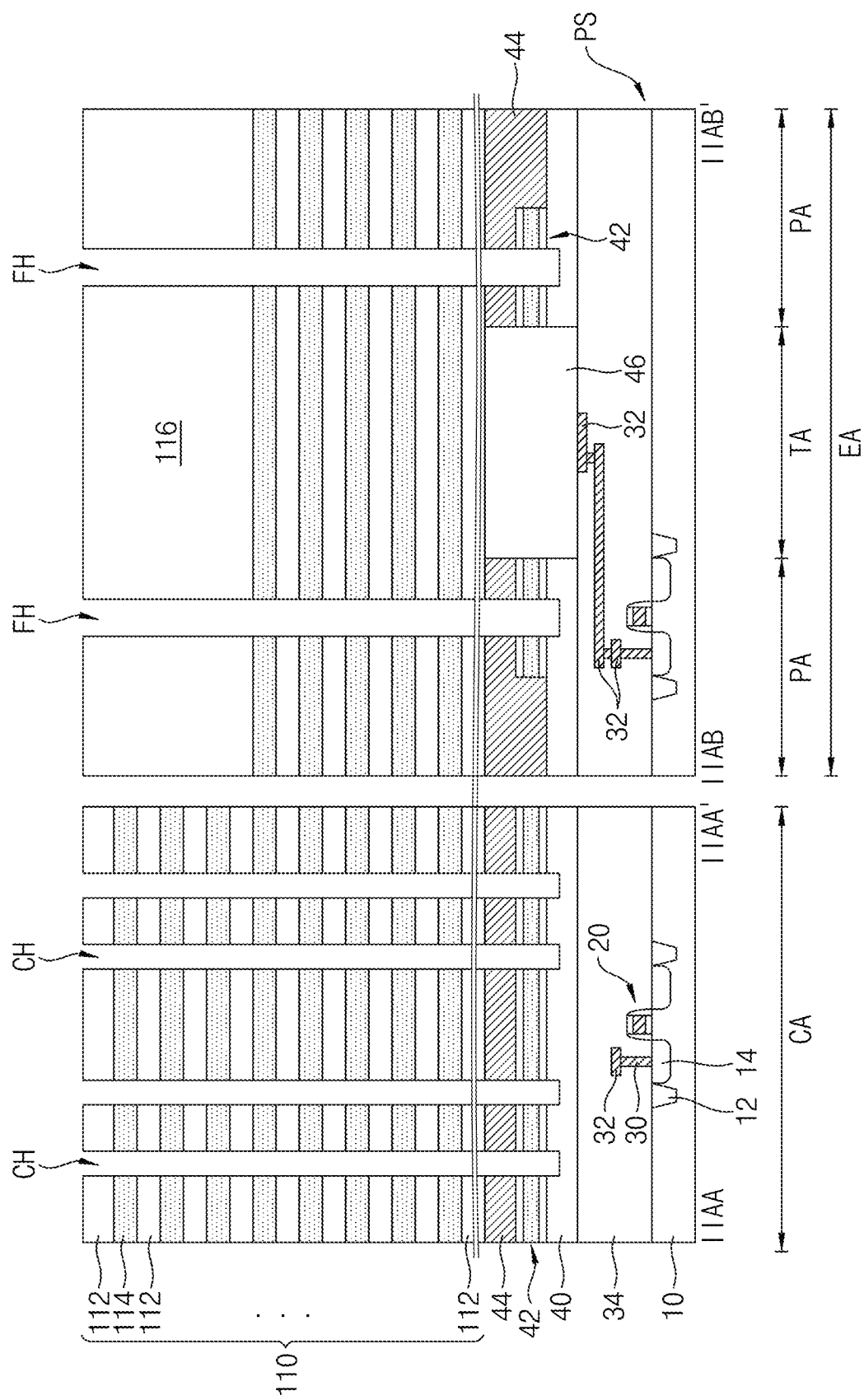
Figure 13B:
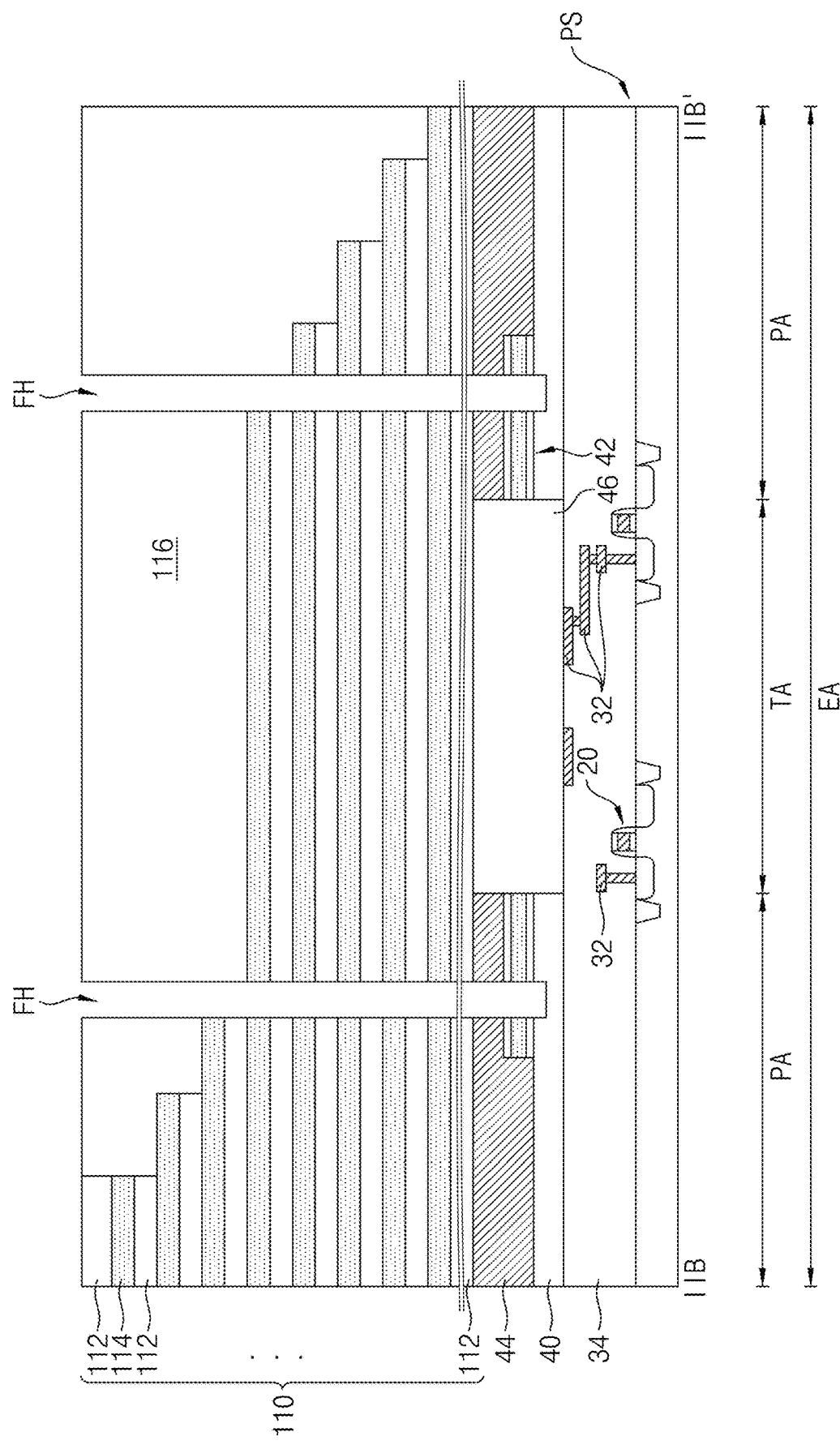

Referring to FIGS. 13A and 13B, the method may include forming channel holes CH and fence holes FH. The channel holes CH may be formed by anisotropically etching the extended mold layer 42, the supporter 44, and the mold stack 110, and may expose the top surface of the lower conductive layer 40. The fence holes FH may be formed by anisotropically etching the extended mold layer 42, the supporter 44, the mold stack 110, and the interlayer insulating layer 116, and may expose the top surface of the lower conductive layer 40. The channel holes CH may be formed within the cell array region CA, and the fence holes FH may be formed within the extension region EA. In an example embodiment, the fence holes FH may be formed in the pad region PA between the cell array region CA and the through electrode region TA, and may surround the through electrode region TA. In an example embodiment, the diameters of the fence holes FH may be formed to be greater than the diameters of the channel holes CH.

Figure 14A:
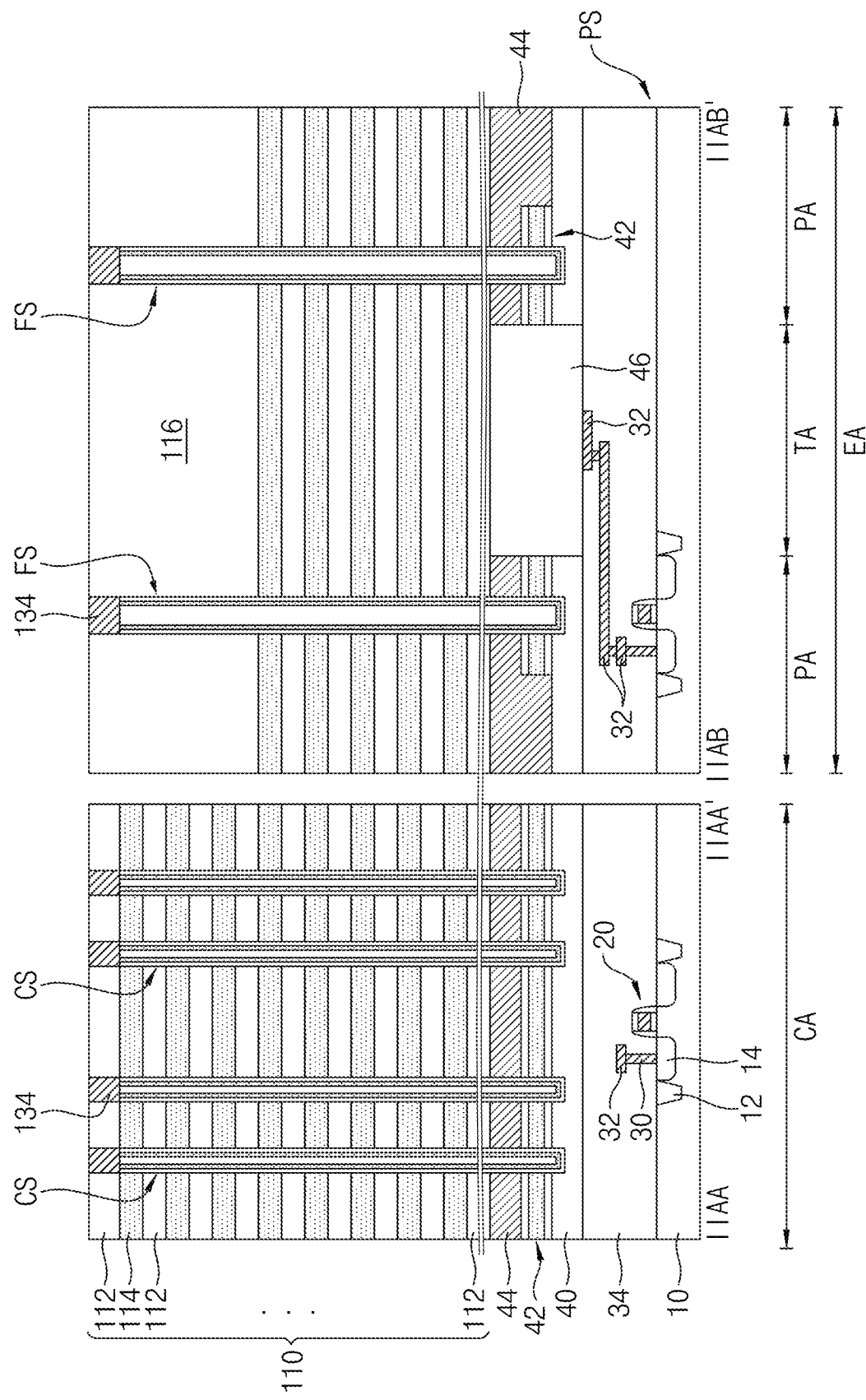
Figure 14B:
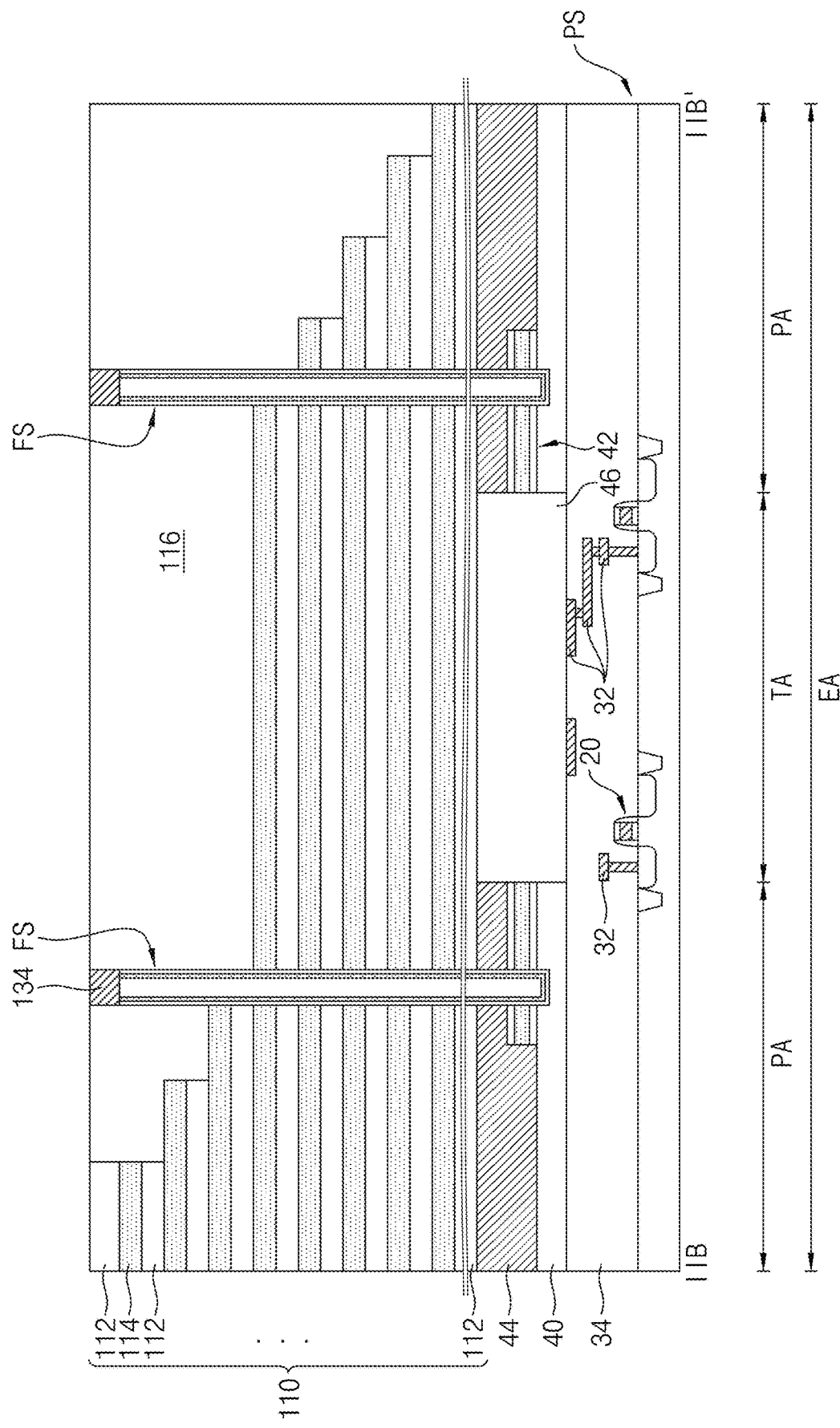

Referring to FIGS. 14A and 14B, the method may include forming vertical structures CS and forming vertical fence structures FS.

The vertical structures CS may be formed in the channel holes CH, and the vertical fence structures FS may be formed in the fence holes FH. Referring further to FIG. 3, the vertical structure CS may include an information storage layer 120, a channel layer 130, and a buried insulating pattern 132. The channel layer 130 may be disposed inside the information storage layer 120, and the buried insulating pattern 132 may be disposed inside the channel layer 130. The information storage layer 120 may include a blocking layer 122, a charge storage layer 124, and a tunnel insulating layer 126. The charge storage layer 124 may be disposed inside the blocking layer 122, and the tunnel insulating layer 126 may be disposed inside the charge storage layer 124. Referring to FIG. 1, in an example embodiment, dummy vertical structures DCS may be formed within the extension region EA. The vertical fence structures FS and the dummy vertical structures DCS may have substantially the same structure as the vertical structure CS.

The conductive pad 134 may be formed on the vertical structures CS and the dummy vertical structures DCS. The conductive pad 134 may be formed on the vertical structures CS. The conductive pad 134 may include a conductive layer such as metal, metal nitride, metal oxide, metal silicide, conductive carbon, polysilicon, or combinations thereof.

Figure 15A:
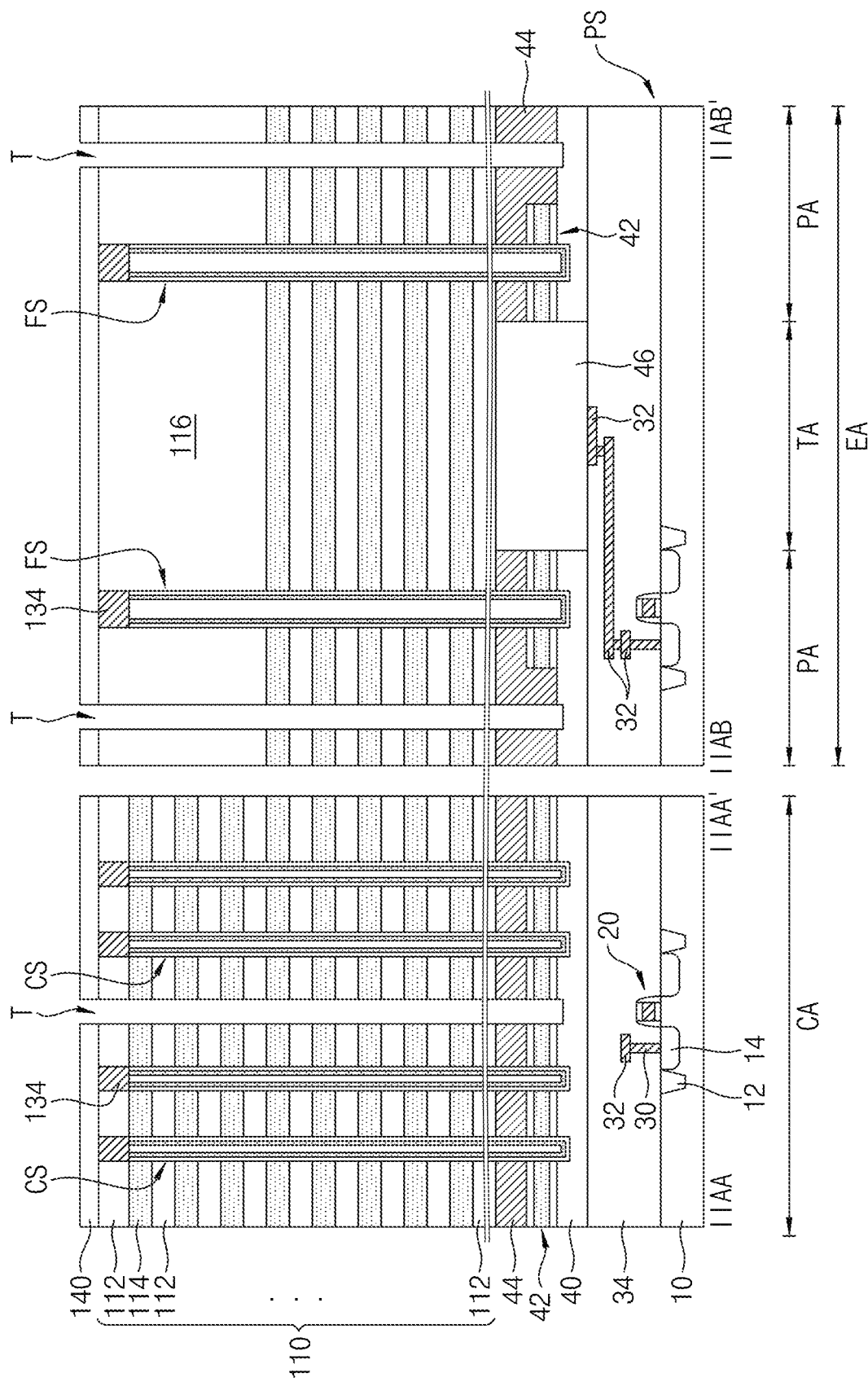
Figure 15B:
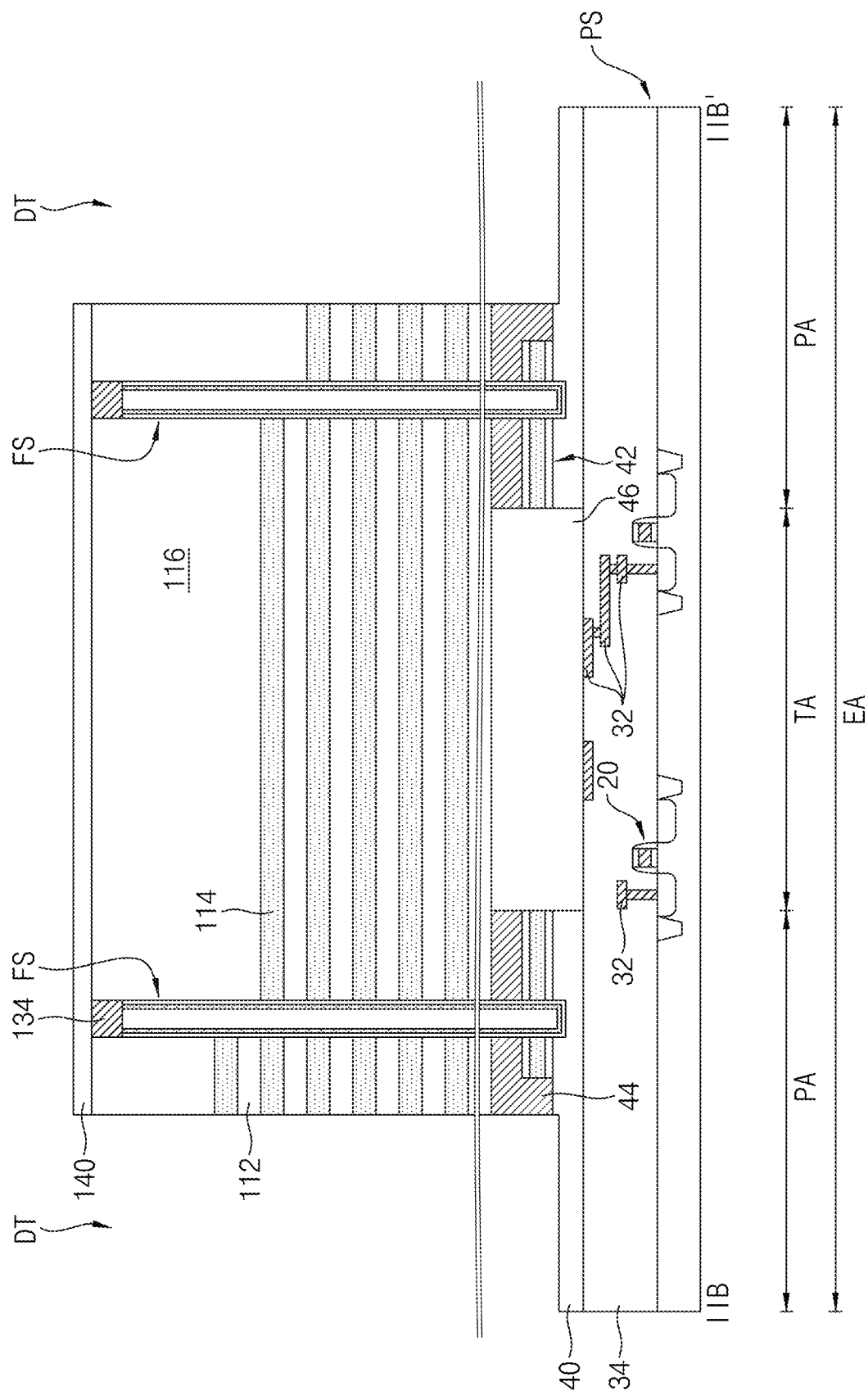

Referring to FIGS. 15A and 15B, the method may include forming an isolation trench T and a dummy isolation trench DT. The forming the isolation trench T and the dummy isolation trench DT may include forming a first upper insulating layer 140 on the mold stack 110 and the interlayer insulating layer 116 and anisotropically etching the extended mold layer 42, the support 44, and the mold stack 110. The isolation trench T and the dummy isolation trench DT may expose the top surface of the lower conductive layer 40, the side surfaces of the mold layers 112, and the side surfaces of the insulating layers 114, and may extend in the same direction. The isolation trench T may be formed over the cell array region CA and the extension region EA, and the dummy isolation trench DT may be formed over a portion of the cell array region CA and a portion of the extension region EA.

Figure 16A:
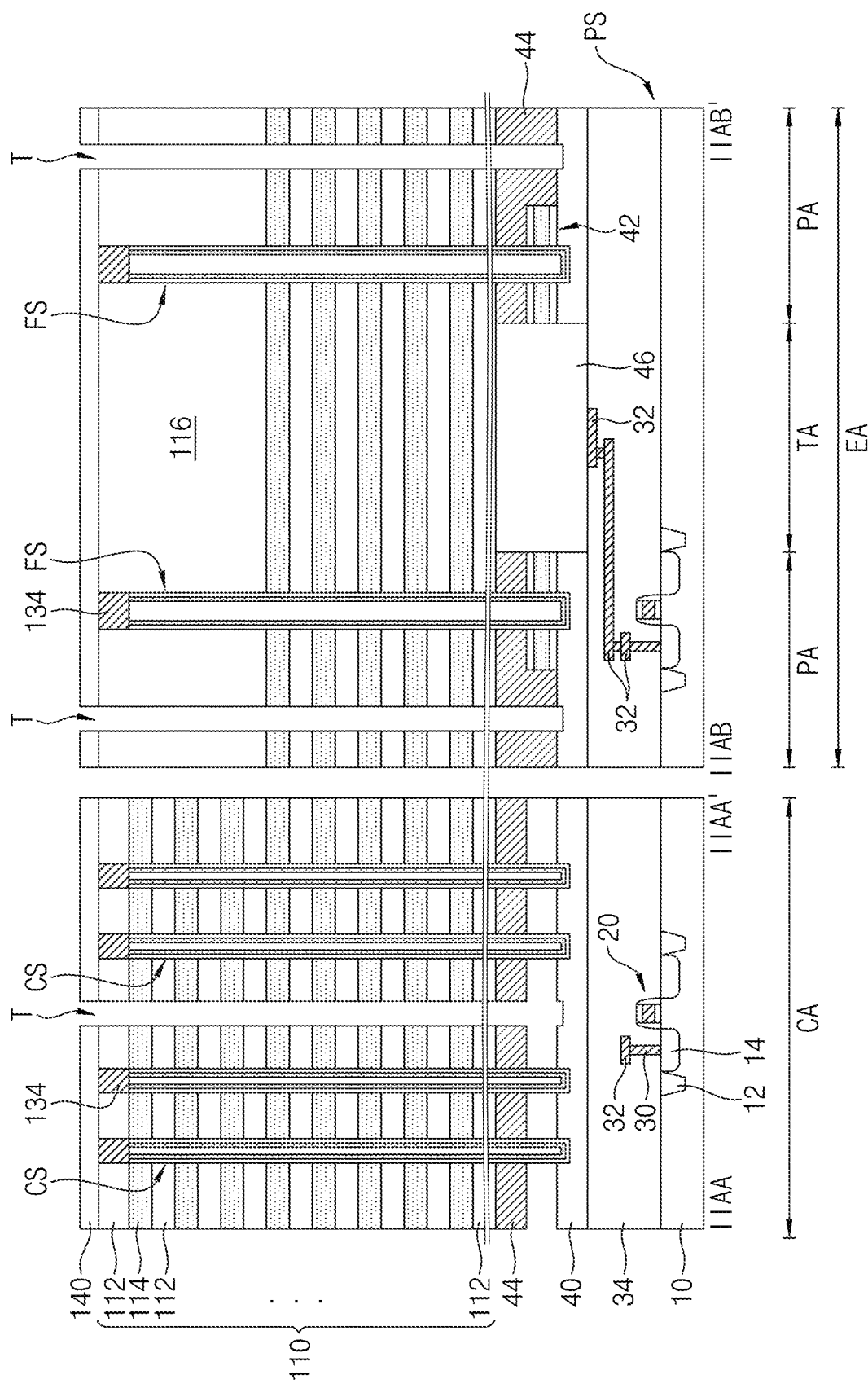
Figure 16B:
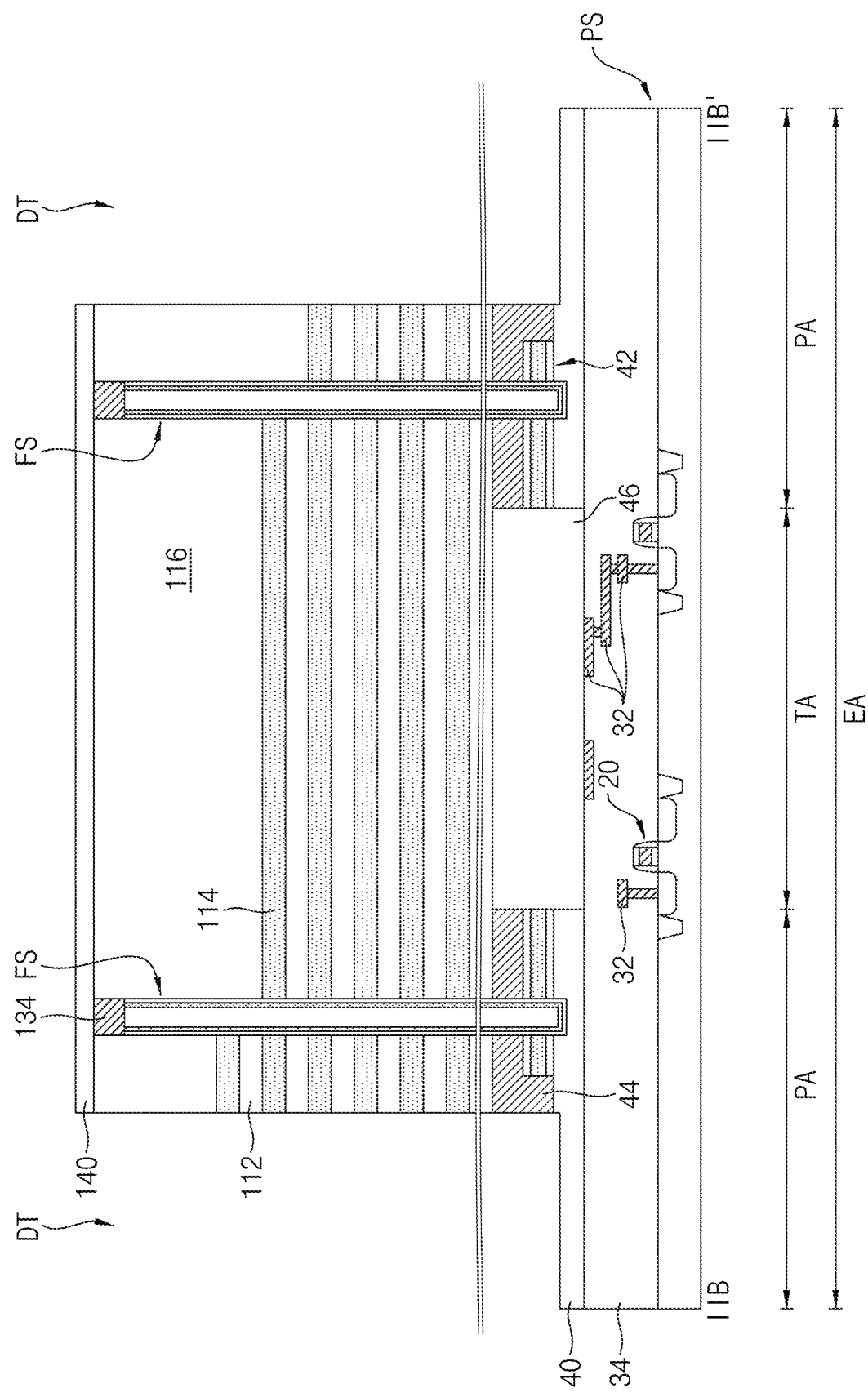

Referring to FIGS. 16A and 16B, the method may include removing the extended mold layer 42 from the cell array region CA. The removing the extended mold layer 42 may include performing a wet etching process. A spacer may be formed on the side surface of the isolation trench T in order to prevent the mold stack 110 and the supporter 44 from being etched. The side surfaces of the vertical structures CS may be partially exposed. Referring further to FIG. 4, a portion of the information storage layer 120 may be etched to expose the channel layer 130. The extended mold layer 42 within the extension region EA may not be removed.

Figure 17A:
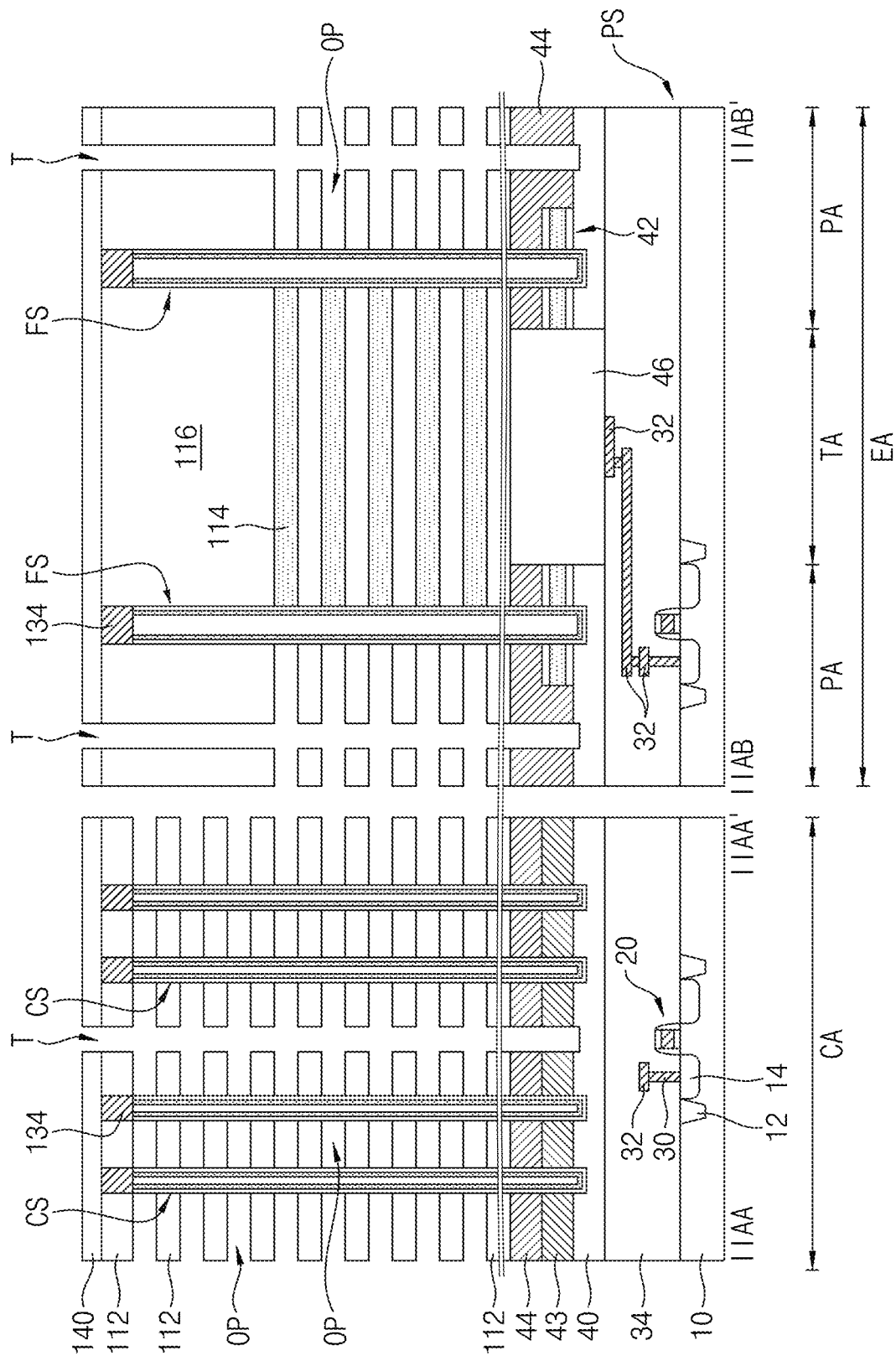
Figure 17B:
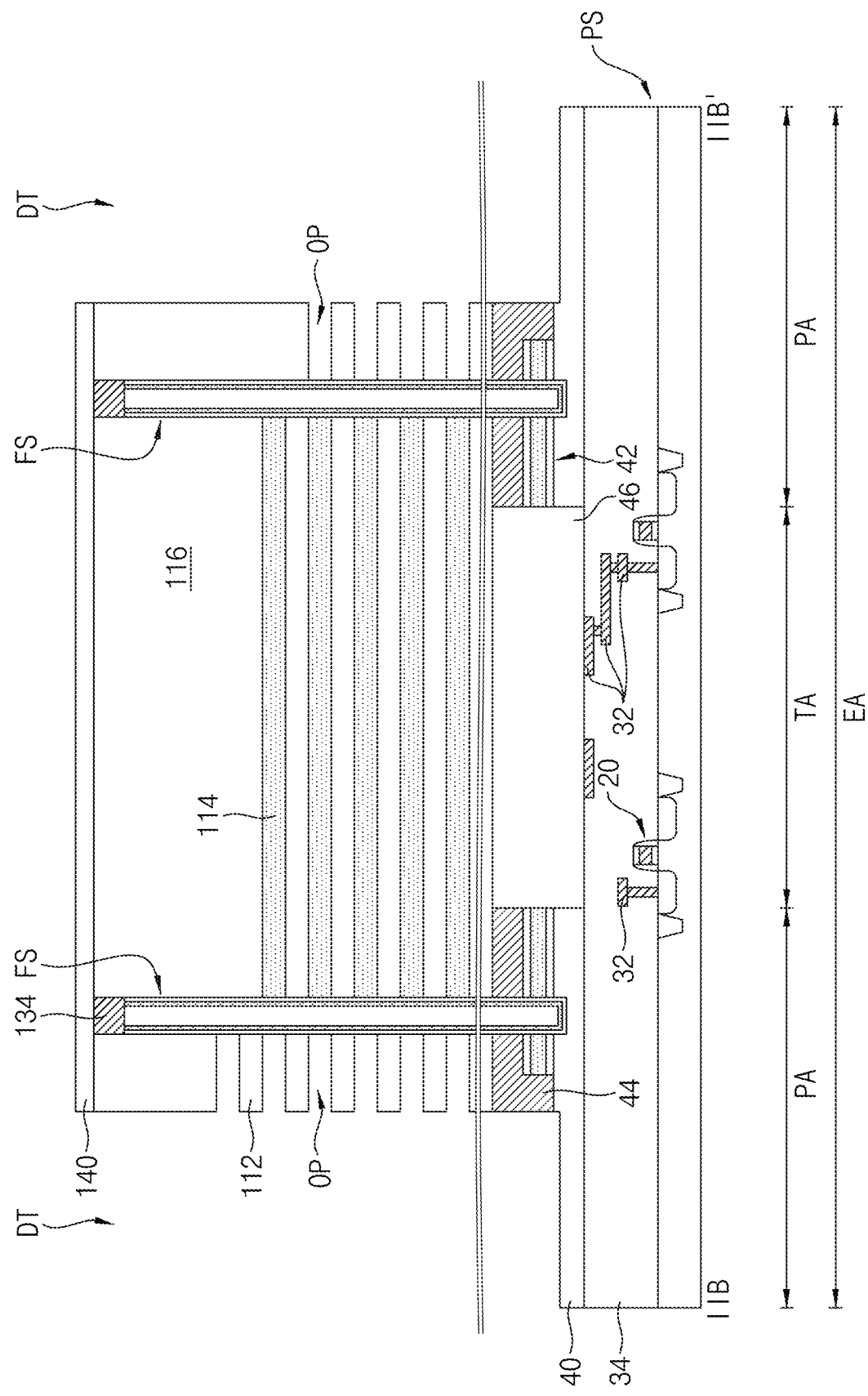

Referring to FIGS. 17A and 17B, the method may include forming an extended conductive layer 43 and removing the insulating layers 114. The extended conductive layer 43 may be formed between the lower conductive layer 40 and the supporter 44, and may be in contact with the side surfaces of the vertical structures CS and the vertical fence structures FS. Referring further to FIG. 4, the extended conductive layer 43 may be in contact with the side surface of the channel layer 130. The extended conductive layer 43 may include metal, metal nitride, metal oxide, metal silicide, polysilicon, conductive carbon, or combinations thereof.

The removing the insulating layers 114 may include performing an isotropic etching process. For example, the insulating layers 114 may be removed by a wet etching process through the isolation trench T and the dummy isolation trench DT. In the removal process, the mold layers 112 may not be removed, and an opening OP may be formed between the mold layers 112. The opening OP may expose the top and bottom surfaces of the mold layers 112, the side surface of the vertical structure CS, and the side surfaces of the vertical fence structures FS. In an example embodiment, the insulating layers 114 may not be removed from the region around the through electrode region TA. For example, the portions of the insulating layers 114 that are located inside a perimeter defined by the vertical fence structures FS may not be removed. In the removal process, the vertical fence structures FS may function as a barrier that interrupts the introduction of an etchant into the perimeter (or circumference) of the through electrode region TA, and may prevent portions of the insulating layers 114 from being removed.

Figure 18A:
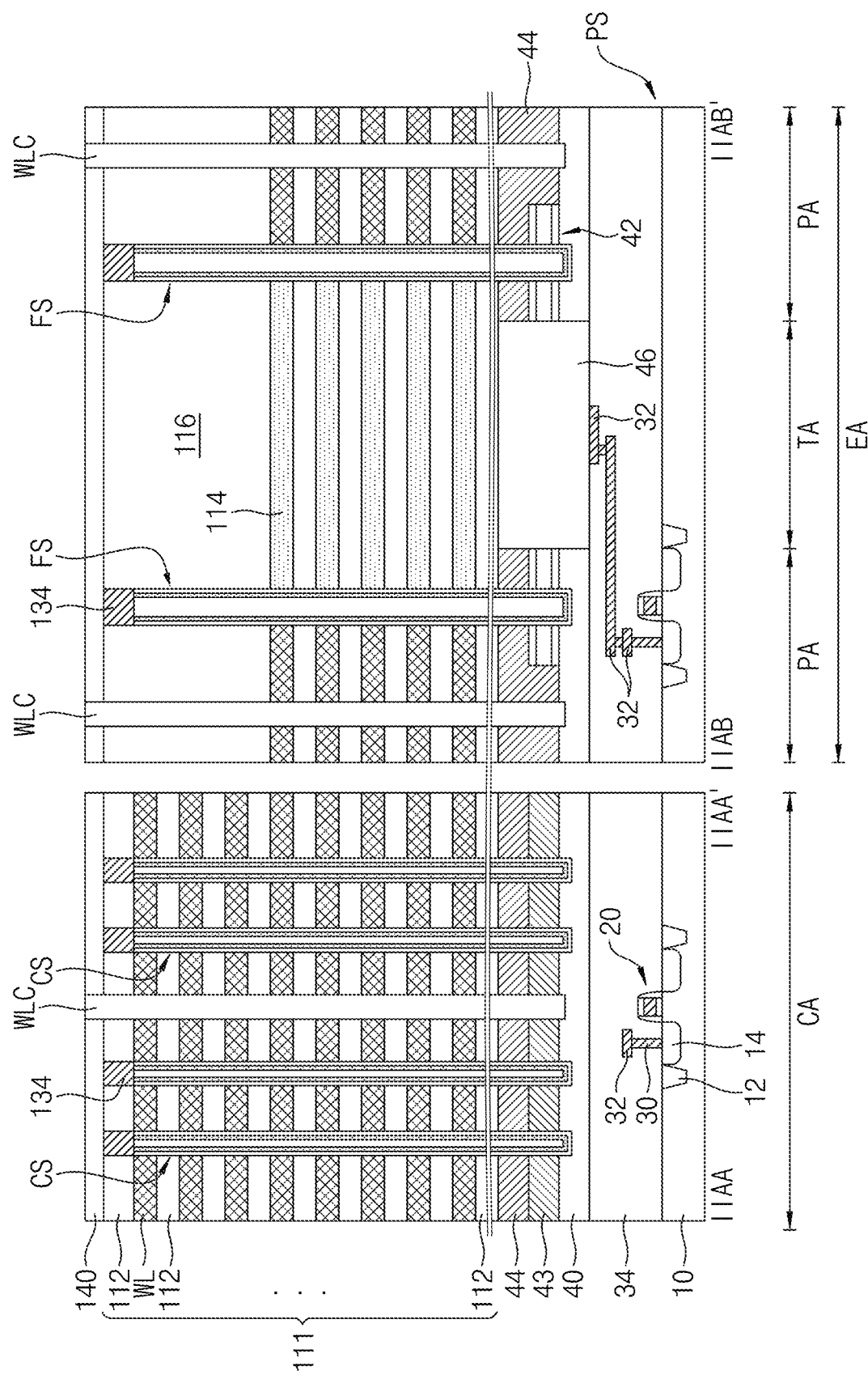
Figure 18B:
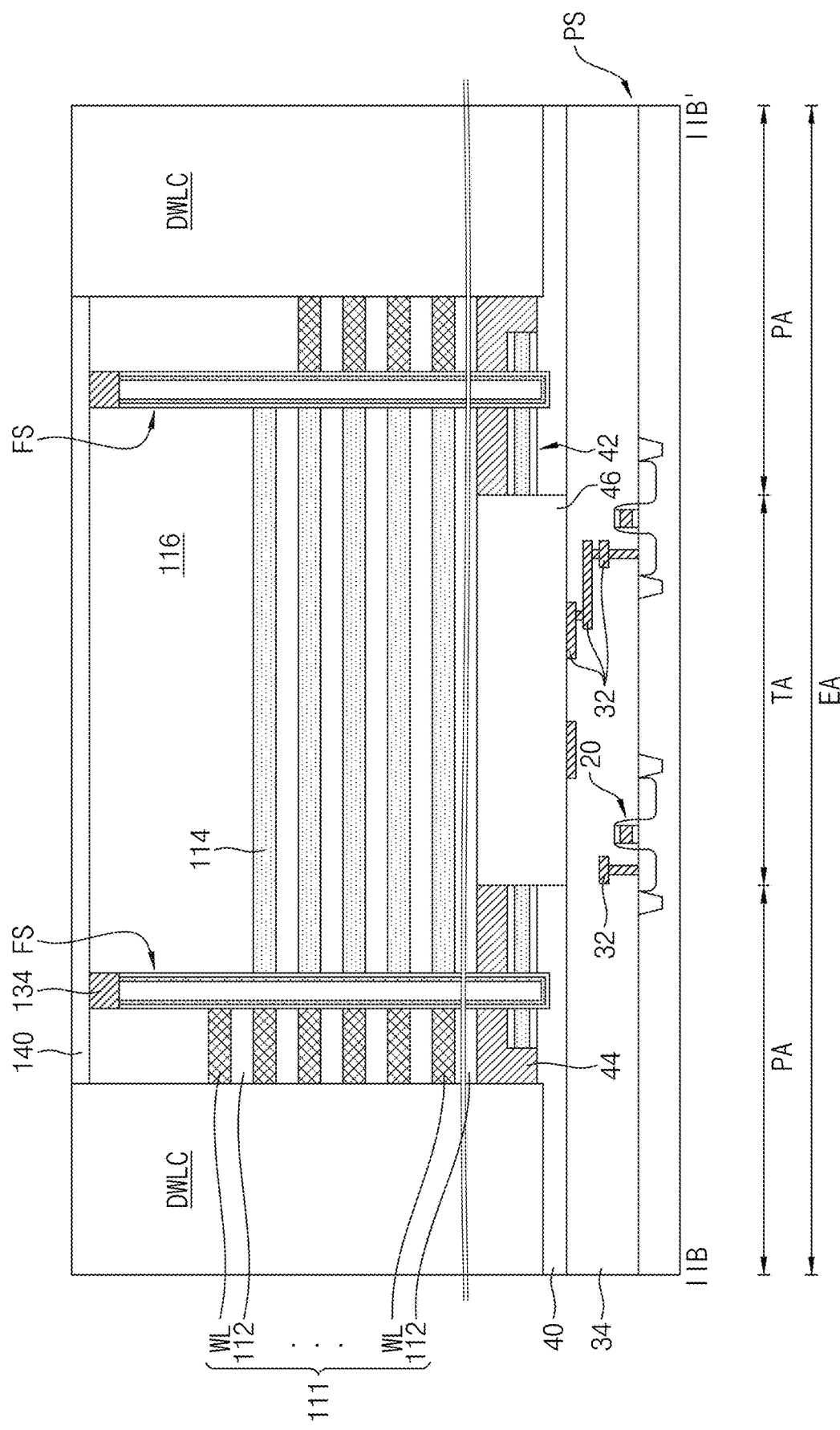

Referring to FIGS. 18A and 18B, the method may include forming electrodes WL and forming an isolation insulating layer WLC and a dummy isolation insulating layer DWLC. The forming the electrodes WL may include performing a deposition process, and the electrodes WL may be formed in the opening OP. For example, the electrodes WL may be formed in a portion of the cell array region CA and a portion of the pad region PA, and may not be formed inside a perimeter defined by the vertical fence structures FS. Some of the electrodes WL may be formed at the same level as the insulating layers 114. The electrodes WL may be alternately stacked with the mold layers 112, and the electrodes WL and the mold layers 112 may constitute the electrode stack 111. The electrodes WL may include W, WN, Ti, TiN, Ta, TaN, or combinations thereof.

The isolation insulating layer WLC and the dummy isolation insulating layer DWLC may be formed by being charged in the isolation trench T and the dummy isolation trench DT. The isolation insulating layer WLC and the dummy isolation insulating layer DWLC may vertically penetrate the extended conductive layer 43, the supporter 44, and the electrode stack 111. The isolation insulating layer WLC may be formed so as to extend from the cell array region CA to the extension region. The dummy isolation insulating layers DWLC may extend in the same direction as the isolation insulating layers WLC, and may be disposed in a portion of the extension region EA. The isolation insulating layer WLC and the dummy isolation insulating layer DWLC may include silicon oxide, silicon nitride, silicon oxynitride, or combinations thereof.

Referring back to FIGS. 2A and 2B, the method may include forming a second upper insulating layer 142, a bit line plug 144, a bit line 146, a through electrode 150, and a connection wire 152. The second upper insulating layer 142 may be formed on the first upper insulating layer 140. The bit line plug 144 may penetrate the first upper insulating layer 140 and the second upper insulating layer 142. The bit line 146 may be formed on the second upper insulating layer 142, and may be connected to the bit line plug 144.

The through electrode 150 may be formed within the through electrode region TA. The through electrode 150 may vertically penetrate the buried insulating layer 46, the electrode stack 111, the interlayer insulating layer 116, the first upper insulating layer 140, and the second upper insulating layer 142, and may be connected to the peripheral circuit wire 32. The connection wire 152 may be formed on the second upper insulating layer 142. The connection wire 152 may be electrically connected to the peripheral circuit wire 32 via the through electrode 150.

The first upper insulating layer 140 and the second upper insulating layer 142 may include silicon oxide, silicon nitride, silicon oxynitride, or combinations thereof. The bit line plug 144, the bit line 146, the through electrode 150, and the connection wire 152 may include metal, metal nitride, metal oxide, metal silicide, polysilicon, conductive carbon, or combinations thereof.

As shown in FIGS. 17A, 17B and 2C, the vertical fence structures FS may limit the horizontal depth of the opening OP by preventing the insulating layer 114 from being etched. In the process of forming the electrodes WL, the introduction and discharge of source gas and/or purge gas may be facilitated. Accordingly, the electrodes WL may be completely charged in the opening OP, and the formation of voids in the electrodes WL may be prevented or reduced.

As is apparent from the above description, according to the example embodiments of the disclosure, vertical fence structures are disposed so as to surround a through electrode region, thereby preventing or reducing the formation of voids in electrodes and bridging of the electrodes.

While some example embodiments of the disclosure have been described with reference to the accompanying drawings, it should be understood by those skilled in the art that various modifications may be made without departing from the scope of the disclosure and without changing essential features thereof. Therefore, the above-described example embodiments should be considered in a descriptive sense only and not for the purposes of limitation.

What is claimed is:

1. A semiconductor device comprising:
    a substrate including a cell array region and an extension region, the extension region extending from the cell array region and including a through electrode region;
    an electrode stack on the substrate, the electrode stack including mold layers and electrodes alternately stacked;
    vertical structures penetrating the electrode stack within the cell array region; and
    vertical fence structures within the extension region and penetrating the electrode stack, the vertical fence structures surrounding the through electrode region in a plan view,
    wherein a distance between adjacent ones of the vertical fence structures is less than a distance between adjacent ones of the vertical structures.

2. The semiconductor device of claim 1, wherein the electrodes include first protrusions protruding between the vertical fence structures in the plan view.

3. The semiconductor device of claim 2, further comprising:
    insulating layers inside a perimeter defined by the vertical fence structures, and the insulating layers at same levels as corresponding ones of the electrodes, respectively,
    wherein the electrodes and the insulating layers are isolated from each other by the vertical fence structures in a vertical cross-sectional view.

4. The semiconductor device of claim 3, wherein the insulating layers include second protrusions protruding between the vertical fence structures in the plan view.

5. The semiconductor device of claim 4, wherein the first protrusions are in contact with the second protrusions between the vertical fence structures.

6. The semiconductor device of claim 2, further comprising:
    a pair of isolation insulating layers extending in a first horizontal direction and vertically penetrating the electrode stack, the pair of isolation insulating layers being spaced apart from each other in a second horizontal direction intersecting the first horizontal direction; and
    dummy isolation insulating layers extending in the first horizontal direction and spaced apart from each other in the second horizontal direction between the pair of isolation insulating layers,
    wherein the vertical fence structures are spaced apart from the dummy isolation insulating layers in the first horizontal direction and are between the pair of isolation insulating layers in the second horizontal direction.

7. The semiconductor device of claim 6, wherein a first maximum distance along the first horizontal direction from the dummy isolation insulating layers to the first protrusions of the electrodes is less than ½ of a distance between an adjacent pair of the dummy isolation insulating layers.

8. The semiconductor device of claim 6, wherein a second maximum distance along the second horizontal direction from the pair of isolation insulating layers to the first protrusions of the electrodes is less than ½ of a distance between an adjacent pair of the dummy isolation insulating layers.

9. The semiconductor device of claim 6, wherein the vertical fence structures have a tapered shape in a vertical cross-sectional view.

10. The semiconductor device of claim 9, wherein a maximum distance along the first horizontal direction from the dummy isolation insulating layers to the first protrusions of a lowermost one of the electrodes is less than ½ of a distance between an adjacent pair of the dummy isolation insulating layers.

11. The semiconductor device of claim 1, wherein the distance between an adjacent pair of the vertical fence structures is less than ½ of the distance between an adjacent pair of the vertical structures.

12. The semiconductor device of claim 1, wherein the vertical fence structures are in contact with each other.

13. The semiconductor device of claim 1, further comprising:
    a dummy vertical structure penetrating the electrode stack within the extension region.

14. The semiconductor device of claim 1, further comprising:
    a peripheral circuit structure between the substrate and the electrode stack; and
    a through electrode vertically penetrating the electrode stack and connected to the peripheral circuit structure within the through electrode region.

15. A semiconductor device comprising:
    a substrate including a cell array region and an extension region, the extension region extending from the cell array region and including a through electrode region, the through electrode region including through electrodes;
    an electrode stack on the substrate, the electrode stack including mold layers and electrodes alternately stacked;
    vertical structures penetrating the electrode stack within the cell array region; and
    inner vertical fence structures and outer vertical fence structures within the extension region and penetrating the electrode stack, the inner vertical fence structures and the outer vertical fence structures surrounding the through electrode region in a plan view,
    wherein a distance between each of the inner vertical fence structures and a corresponding one of the outer vertical fence structures is less than a distance between each of the inner vertical fence structures and a corresponding one of the through electrodes, and
    wherein the distance between each of the inner vertical fence structures and a corresponding one of the outer vertical fence structures is less than a distance between adjacent ones of the vertical structures.

16. The semiconductor device of claim 15, further comprising:
    insulating layers at same levels as corresponding ones of the electrodes, respectively, the insulating layers being inside a perimeter defined by the inner and outer vertical fence structures, and the insulating layers being in contact with the electrodes and the inner and outer vertical fence structures, wherein boundary surfaces between the electrodes and the insulating layers are between the inner vertical fence structures and the outer vertical fence structures in the plan view, and wherein the electrodes include first protrusions that are configured to be in contact with the inner vertical fence structures and the outer vertical fence structures in the plan view.

17. The semiconductor device of claim 15, wherein the inner vertical fence structures are spaced apart from each other along a perimeter of the through electrode region, and the outer vertical fence structures are spaced apart from each other along the perimeter of the through electrode region.

18. The semiconductor device of claim 15, wherein a distance between one of the inner vertical fence structures and one of the outer vertical fence structures adjacent thereto is less than ½ of a distance between the vertical structures.

19. The semiconductor device of claim 15, wherein diameters of the outer vertical fence structures are greater than diameters of the inner vertical fence structures.

20. A semiconductor device comprising:

a substrate including a cell array region and an extension region, the extension region extending from the cell array region and including a through electrode region;

an electrode stack on the substrate, the electrode stack including mold layers and electrodes alternately stacked;

a peripheral circuit structure between the substrate and the electrode stack;

a lower conductive layer on the peripheral circuit structure;

a connection conductive layer on the lower conductive layer within the cell array region;

a connection mold layer on the lower conductive layer within the extension region;

a supporter on the connection conductive layer and the connection mold layer, the supporter having the electrode stack thereon;

a buried insulating layer in the through electrode region while penetrating the lower conductive layer, the connection mold layer, and the supporter;

vertical structures penetrating the electrode stack within the cell array region;

vertical fence structures in the extension region while penetrating the electrode stack, the vertical fence structures surrounding the through electrode region in a plan view; and insulating layers being inside a perimeter defined by the vertical fence structures, and the insulating layers being at same levels as corresponding ones of the electrodes, respectively, wherein the electrodes include first protrusions configured to be in contact with the vertical fence structures in the plan view.

* * * * *